United States Patent
Sano et al.

(10) Patent No.: US 8,912,095 B2
(45) Date of Patent: Dec. 16, 2014

(54) POLISHING METHOD, POLISHING APPARATUS AND POLISHING TOOL

(75) Inventors: Yasuhisa Sano, Osaka (JP); Kazuto Yamauchi, Osaka (JP); Junji Murata, Osaka (JP); Takeshi Okamoto, Osaka (JP); Shun Sadakuni, Osaka (JP); Keita Yagi, Tokyo (JP)

(73) Assignees: Osaka University, Tokyo (JP); Ebara Corporation, Tokyo (JP)

( * ) Notice: Subject to any disclaimer, the term of this patent is extended or adjusted under 35 U.S.C. 154(b) by 74 days.

(21) Appl. No.: 13/511,802

(22) PCT Filed: Dec. 14, 2010

(86) PCT No.: PCT/JP2010/072837
§ 371 (c)(1),
(2), (4) Date: May 24, 2012

(87) PCT Pub. No.: WO2011/074691
PCT Pub. Date: Jun. 23, 2011

(65) Prior Publication Data
US 2012/0244649 A1    Sep. 27, 2012

(30) Foreign Application Priority Data

Dec. 15, 2009 (JP) .................................. 2009-284494

(51) Int. Cl.
*H01L 21/302* (2006.01)
*H01L 21/461* (2006.01)
(Continued)

(52) U.S. Cl.
CPC .......... *H01L 21/02024* (2013.01); *B24B 49/12* (2013.01); *B24B 37/30* (2013.01); *B24B 37/042* (2013.01); *B24B 37/0053* (2013.01); *B24B 37/10* (2013.01)

USPC ............ 438/692; 438/690; 438/691; 438/693

(58) Field of Classification Search
USPC ........................................................ 438/692
See application file for complete search history.

(56) References Cited

U.S. PATENT DOCUMENTS

| 4,889,586 A | 12/1989 | Noguchi et al. |
| 7,252,575 B2 | 8/2007 | Kobayashi et al. |

(Continued)

FOREIGN PATENT DOCUMENTS

| JP | 1-253239 | 10/1989 |
| JP | 05-136118 | 6/1993 |

(Continued)

OTHER PUBLICATIONS

International Search Report issued Mar. 8, 2011 in International (PCT) Application No. PCT/JP2010/072837.

(Continued)

*Primary Examiner* — Thien F Tran
(74) *Attorney, Agent, or Firm* — Wenderoth, Lind & Ponack, L.L.P.

(57) ABSTRACT

A polishing method and a polishing apparatus finish a surface of a substrate of a compound semiconductor containing an element such as Ga or the like to a desired level of flatness, so that the surface can be flattened with high surface accuracy within a practical processing time. In the presence of water, such as weak acid water, water with air dissolved therein, or electrolytic ion water, the surface of the substrate made of a compound semiconductor containing either one of Ga, Al, and In and a surface of a polishing pad having an electrically conductive member in an area of the surface which is held in contact with the substrate) are relatively moved while being held in contact with each other, thereby polishing the surface of the substrate.

19 Claims, 25 Drawing Sheets

(51) Int. Cl.
| | |
|---|---|
| B24B 49/12 | (2006.01) |
| B24B 37/30 | (2012.01) |
| B24B 37/04 | (2012.01) |
| H01L 21/02 | (2006.01) |
| B24B 37/005 | (2012.01) |
| B24B 37/10 | (2012.01) |

(56) References Cited

U.S. PATENT DOCUMENTS

| | | | |
|---|---|---|---|
| 7,651,625 | B2 | 1/2010 | Yamauchi et al. |
| 7,776,228 | B2 | 8/2010 | Yamauchi et al. |
| 2005/0269577 | A1* | 12/2005 | Ueda et al. ............ 257/80 |
| 2009/0095712 | A1 | 4/2009 | Yamauchi et al. |

FOREIGN PATENT DOCUMENTS

| | | |
|---|---|---|
| JP | 2004-154928 | 6/2004 |
| JP | 2006-114632 | 4/2006 |
| JP | 2007-109777 | 4/2007 |
| JP | 2008-71857 | 3/2008 |
| JP | 2008-121099 | 5/2008 |
| JP | 2009-117782 | 5/2009 |
| JP | 2009-241213 | 10/2009 |
| JP | 2010-251699 | 11/2010 |
| WO | 2010-110463 | 9/2010 |

OTHER PUBLICATIONS

Hideyuki Hara et al., "Novel Abrasive-Free Planarization of Si and SiC Using Catalyst", The 11th International Conference on Precision Engineering (ICPE), pp. 267-270 (Aug. 16-18, 2006, Tokyo, Japan).

Hideyuki Hara et al. "Damage-Free Planarization of 4H-SiC (0001) by Catalyst-Referred Etching", Programme of The 6th European Conference on Silicon Carbide and Related Materials (ECSCRM 2006), p. 28 (Sep. 3-7, 2006, Newcastle upon Tyne, UK).

Kenta Arima et al., "Atomic-Scale Characterization of Semiconductor Surfaces After Wet Cleaning", Extended Abstracts of International 21st Century COE Symposium on Atomistic Fabrication Technology, pp. 59-60 (Oct. 19-20, 2006, Osaka, Japan).

H. Hara et al, "Development of CAtalyst-Referred Etching", Extended Abstracts of International 21st Century COE Symposium on Atomistic Fabrication Technology, pp. 27-28 (Oct. 19-20, 2006, Osaka, Japan).

K. Yagi et al., "Fabrication of Damascene Cu Wiring Using Solid Acid Catalyst", Extended Abstracts of International 21st Century COE Symposium on Atomistic Fabrication Technology, pp. 85-86 (Oct. 19-20, 2006, Osaka, Japan).

Ryota Okamoto et al., "Scanning Tunneling Microscopy Study of 4H-SiC (0001) Surfaces after Wet-Chemical Preparations", Extended Abstracts of International 21st Century COE Symposium on Atomistic Fabrication Technology, pp. 125-126 (Oct. 19-20, 2006, Osaka, Japan).

Keita Yagi et al., "Damage-Free Planarization of 4H-SiC Using Catalyst Plate", Proceedings of 15th International Conference on Crystal Growth, Abstract#859 (Aug. 12-17, 2007, Salt Lake City, UT, USA).

Junji Murata et al., "Damage-Free Planarization of GaN Using a Catalyst Plate", Proceedings of 15th International Conference on Crystal Growth, Abstract#789 (Aug. 12-17, 2007, Salt Lake City, UT, USA).

Hideyuki Hara et al., "New Crystal Planarization Technique Using A Catalyst Plate", Proceedings of 15th International Conference on Crystal Growth, Abstract#769 (Aug. 12-17, 2007, Salt Lake City, UT, USA).

Kenta Arima et al., "Development of Wet-Chemical Procedures to Control Emerging Semiconductor Surfaces on the Atomic Scale", Extended Abstracts of International 21st Century COE Symposium on Atomistic Fabrication Technology 2007, pp. 51-52 (Oct. 15-17, 2007, Osaka, Japan).

Keita Yagi et al. "Development of Planarization Equipment Using Catalyst-Referred Etching", Extended Abstracts of International 21st Century COE Symposium on Atomistic Fabrication Technology 2007, pp. 35-36 (Oct. 15-17, 2007, Osaka, Japan).

Akihisa Kubota et al. "Polishing Characteristics of Single Crystal SiC Surface Finished by Fe—Catalyst Rod Under $H_2O_2$ Solution", Extended Abstracts of International 21st Century COE Symposium on Atomistic Fabrication Technology 2007, pp. 129-130 (Oct. 15-17, 2007, Osaka, Japan).

Junji Murata et al. "Novel Abrasive-Free Planarization of GaN Using a Catalytic Reference Plate", Extended Abstracts of International 21st Century COE Symposium on Atomistic Fabrication Technology 2007, pp. 127-128 (Oct. 15-17, 2007, Osaka, Japan).

Hideyuki Hara et al. "Planarization Mechanism of Catalyst-Referred Etching", Extended Abstracts of International 21st Century COE Symposium on Atomistic Fabrication Technology 2007, pp. 37-38 (Oct. 15-17, 2007, Osaka, Japan).

Kenta Arima et al. "Atomically Resolved STM Study of 4H-SiC(0001) Surfaces Flattened by Chemical Etching in HF Solutions with Pt Catalyst", International Conference on Silicon Carbide and Related Materials, 2007 Technical Digest (ICSCRM 2007), pp. We-28-We-29 (Oct. 14-19, 2007, Otsu, Japan).

J. Murata et al., "New Chemical Planarization of SiC and GaN Using Fe Plate in $H_2O_2$ Solution", International Conference on Silicon Carbide and Related Materials 2007, Technical Digest (ICSCRM 2007), pp. Th-13-Th-14 (Oct. 14-19, 2007, Otsu, Japan).

T. Okamoto et al., "Damage-Free Planarization of 2-inch 4H-SiC Wafer Using Pt Catalyst Plate and HF Solution", International Conference on Silicon Carbide and Related Materials 2007, Technical Digest (ICSCRM 2007), pp. We-94-We-95 (Oct. 14-19, 2007, Otsu, Japan).

K. Yamauchi et al., "Catalyst-Referred Etching—Damage-Free Planarization of 4H-SiC (0001)-", 4th International Workshop on Crystal Growth Technology, p. 87 (May 18-25, 2008, Beatenberg above Interlaken, Switzerland).

Y. Sano et al., "Development of Ultraprecision Machining Technologies for Semiconductor Substrates", Extended Abstracts of First International Symposium on Atomically Controlled Fabrication Technology-Surface and Thin Film Processing-, pp. 16-17 (Feb. 16-17, 2009, Osaka, Japan).

H. Hara et al., "First-Principles Calculation of Surface Energy at 4H-SiC(0001)—1×1", Extended Abstracts of First International Symposium on Atomically Controlled Fabrication Technology-Surface and Thin Film Processing-, pp. 62-63 (Feb. 16-17, 2009, Osaka, Japan).

J. Murata et al., "Photo-Enhanced Chemical Planarization of Gallium Nitride Using a Solid Acidic Catalyst", Extended Abstracts of First International Symposium on Atomically Controlled Fabrication Technology-Surface and Thin Film Processing-, pp. 60-61 (Feb. 16-17, 2009, Osaka, Japan).

T. Okamoto et al. "Novel Abrasive-Free Chemical Planarization of 4H-SiC 8° off Wafer Using a Catalyst", Extended Abstracts of First International Symposium on Atomically Controlled Fabrication Technology-Surface and Thin Film Processing-, pp. 64-65 (Feb. 16-17, 2009, Osaka, Japan).

S. Sadakuni et al., "Planarization of GaN Using Photoelectrochemical Process and Solid Catalyst", Technical Digest of International Conference on Silicon Carbide and Related Materials 2009, p. I-160 (Oct. 11-16, 2009, Nurnberg, Germany).

* cited by examiner

P-V:47.59 nm, rms: 6.616 nm, Ra: 5.271nm

P-V:47.748 nm, rms: 5.984 nm, Ra: 4.017 nm

P-V:3.342 nm, rms: 0.448 nm, Ra: 0.363 nm

P-V:0.880 nm, rms: 0.105 nm, Ra: 0.083 nm

POLISHING METHOD, POLISHING APPARATUS AND POLISHING TOOL

TECHNICAL FIELD

The present invention relates to a polishing method and a polishing apparatus, and more particularly to a polishing method and a polishing apparatus for performing the planarization polishing of a surface (surface to be processed) of a substrate such as a single substrate made of a compound semiconductor containing an element such as Ga, Al, In, or the like, or a bonded substrate (epitaxial substrate) on which a compound semiconductor containing an element such as Ga, Al, In, or the like is mounted. The present invention is also related to a polishing method and a polishing apparatus, such as a catalyst-referred chemical processing system, for performing the planarization polishing of a surface (surface to be processed) of a substrate while monitoring the progress of a polishing process in order to determine the timing of an endpoint of the polishing process. (e. g., stoppage of polishing process or change of polishing conditions). Furthermore, the present invention relates to a polishing tool provided in such as the catalyst-referred chemical processing system.

BACKGROUND ART

The applicant has proposed a catalyst-referred chemical processing system for processing a surface (surface to be processed) of a substrate by placing the substrate in an acid processing solution, placing an acid or basic solid catalyst in contact with or in close proximity with the surface of the substrate, and eluting surface molecules of the surface which is held in contact with or in close proximity with the solid catalyst into the acid processing solution (see Japanese laid-open patent publication No. 2008-121099). According to the catalyst-referred chemical processing system, the surface of the substrate (workpiece) is irradiated with light, preferably ultraviolet light, or a voltage is applied between the substrate and the solid catalyst, to promote oxidization of the surface for an increasing machining rate. The catalyst-referred chemical processing system makes it possible to planarize the surface of the substrate with only a chemical action while causing little damage to the surface of the substrate. However, it is generally difficult to planarize a surface of a single substrate made of a compound semiconductor containing an element Ga, for example, to a sufficiently highly accurate surface roughness within a practical given period of time.

Demands for finer and multi-layered interconnects for highly integrated semiconductor devices in recent years require that the surface of films such as metal films on the surface of substrates such as semiconductor wafers or the like be planarized to a high degree. To meet such demands, it has widely been customary to planarize the surface of films on the surface of substrates by removing surface irregularities therefrom according to chemical mechanical polishing (CMP). In a chemical mechanical polishing process, it is necessary while a film is being polished to monitor the polished state of the film in order to stop polishing the film at a desired position. Therefore, it has been the general practice to monitor the polished state of an electrically conductive metal film formed on a surface of a substrate by applying an inductive magnetic field to the metal film and detecting the rate of attenuation of an eddy current generated in the surface of the metal film with an eddy current sensor for thereby measuring the thickness of the metal film.

The applicant has proposed an apparatus for monitoring the polished state of a film formed on a surface of a substrate by applying light to a surface (surface to be polished) of a film on a surface of a substrate, breaking up the light reflected from the surface into spectral data with a spectrometer, and measuring the thickness of the film based on the spectral data (see Japanese laid-open patent publication No. 2004-154928).

The applicant has also proposed a polishing method of polishing a surface (surface to be polished) of a semiconductor substrate by holding the surface of the semiconductor substrate and a contact platen (polishing tool), at least the surface of which is made of a catalyst, in contact with each other and moving them relative to each other within a processing liquid, as a polishing method of precisely and efficiently polishing a semiconductor substrate of a hard-to-process material such as Sic, GaN, or the like (see Japanese laid-open patent publication No. 2009-117782). The contact platen comprises, for example, a base of molybdenum or the like and a catalyst of platinum or the like which is attached to a surface of the base.

SUMMARY OF INVENTION

Technical Problem

The applicant has found that when a substrate of a compound semiconductor containing an element Ga is immersed in a processing liquid comprising a pH buffer solution of a neutral pH which contains Ga ions, and light is applied to the surface of the substrate or a bias potential is applied to the substrate, a Ga oxide is formed on the surface of the substrate, and the formed Ga oxide can be polished away by holding the Ga oxide and a polishing platen (polishing tool) in contact with each other and moving them relative to each other (see Japanese patent application No. 2009-78234).

However, it has been discovered that if light is applied to the surface of the substrate or a bias potential is applied to the substrate to form a Ga oxide, and the Ga oxide is polished away to flat the surface of the substrate of the compound semiconductor containing the element Ga, then it takes a long time to polish the surface of the substrate until the polished surface achieves a desired level of flatness or the polished surface fails to achieve a sufficient level of flatness.

For example, in a process of fabricating a substrate made of a semiconductor alone, called a bare substrate, a mass of semiconductor material known as an ingot is cut into substrates, and thereafter each surface of the substrate is polished for removing damage therefrom. Heretofore, however, although the progress of the polishing process can be monitored for the purposes of removing a film formed on a surface of a substrate and planarizing the surface of the film based on the measuring principles, the progress of the polishing process cannot be monitored for the purpose of removing damage from a surface of a substrate free of a film, such as a bare substrate.

It has been found that if a contact platen (polishing tool) is constructed of a base cut to a certain shape and a catalyst attached to a surface of the base, for example, then a polished surface of a workpiece after it has been polished by the contact platen tends to be scratched by burrs formed on the surface of the base when it was cut, and the surface irregularities of the surface of the base tend to be transferred to the polished workpiece. The catalyst of the contact platen serves as a catalyst in the reception of electrons between the surface of the catalyst and the surface of the workpiece. The catalyst needs to be periodically replaced because it is mechanically worn when the surface of the workpiece is processed while the catalyst and the workpiece are pressed against each other and moved relative to each other. It has also been found that if a contact platen is constructed of a base such as of molybdenum or the like and a catalyst such as of platinum or the like attached to a surface of the base, then it is necessary to replace the contact platen as a whole when the catalyst is to be replaced, and hence the contact platen is highly costly.

The present invention has been made in view of the above situation. It is therefore a first object of the present invention to provide a polishing method and a polishing apparatus which are particularly suitable for finishing a surface of a substrate of a compound semiconductor containing an element such as Ga or the like to a desired level of flatness, so that a surface of a substrate of a compound semiconductor containing an element of Ga can be flattened with high surface accuracy within a practical processing time.

It is a second object of the present invention to provide a polishing method and a polishing apparatus which are capable of polishing a surface of a substrate such as a bare substrate made of a semiconductor alone while monitoring the progress of the polishing process by measuring a level of damage to the surface of the substrate at the same time that the surface of the substrate is polished.

It is a third object of the present invention to provide a polishing tool which is capable of producing a polished surface that is flat and less scratched and which is made inexpensive and durable by basically allowing only a catalyst to be replaced, and a polishing apparatus incorporating such a polishing tool.

Solution to Problem

The present invention provides a polishing method of polishing a surface of a substrate made of a compound semiconductor containing either one of Ga, Al, and In by relatively moving the surface of the substrate and a surface of a polishing pad having an electrically conductive member in an area of the surface which is held in contact with the substrate, while holding the surface of the substrate and the surface of the polishing pad in contact with each other, in the presence of weak acid water, water with air dissolved therein, or electrolytic ion water.

The surface of the substrate, which is made of a compound semiconductor containing an element such as Ga or the like, can thus be finished to a high level of flatness. By combining the finishing process with a polishing process involving the application of light and/or the application of a bias potential, the time required to polish the surface of the substrate, which is made of a compound semiconductor containing an element such as Ga or the like, can greatly be reduced.

In a preferred aspect of the present invention, the weak acid water or the water with air dissolved therein has a pH in the range from 3.5 to 6.0.

The weak acid water, which has a pH in the range from 3.5 to 6.0, is manufactured by dissolving a gas of $CO_2$ into pure water or tap water, for example, without the addition of an acid, a pH buffer, or an oxidizer ($H_2O_2$, ozone water, persulfate, or the like). The water with air dissolved therein which has a pH in the range from 3.5 to 6.0 is manufactured by bringing pure water or tap water into contact with air and dissolving $CO_2$ in air into the water. The water with air dissolved therein may be manufactured by positively dissolving air with a gas dissolver or naturally dissolving air by exposing pure water or tap water to an air atmosphere. Preferably, the pH of the weak acid water or water with air dissolved therein should be in the range from 3.5 to 5.5.

The present invention also provides another polishing method of polishing a surface of a substrate at least partly made of a compound semiconductor containing either one of Ga, Al, and In by relatively moving the surface of the substrate and a surface of a polishing pad having an electrically conductive member in an area of the surface which is held in contact with the substrate, while holding the surface of the substrate and the surface of the polishing pad in contact with each other, in the presence of water, water with air dissolved therein, or electrolytic ion water. The water is preferably $N_2$-purged water.

In a preferred aspect of the present invention, the water with air dissolved therein comprises water with $CO_2$ in air being dissolved therein while the surface of the substrate is being polished in an air atmosphere after the surface of the substrate has started being polished by the polishing pad which is supplied with pure water or tap water.

In a preferred aspect of the present invention, the electrically conductive member is made of a precious metal, a transition metal, graphite, electrically conductive resin, electrically conductive rubber, or electrically conductive organic matter.

The previous metal may be platinum or gold, and the transition metal may be Ag, Fe, Ni, or Co. The electrically conductive organic matter may be polyacetylene, polyparaphenyline, polyaniline, polythiofuran or polyparaphenylinevinylene.

In a preferred aspect of the present invention, the compound semiconductor containing either one of Ga, Al, and In comprises GaN, GaP, GaAs, AlN, AlP, AlAs, InN, InP, or InAs.

Since an oxide of GaN, GaP, GaAs, AlN, AlP, AlAs, InN, InP, or InAs is dissolvable in a weak acid or weak alkali aqueous solution, they can be used in the polishing method according to the present invention.

In a preferred aspect of the present invention, the electrolytic ion water has a pH in the range from 3.5 to 6.0 or of 8.0 or higher.

In a preferred aspect of the present invention, the surface of the substrate is polished while applying excitation light to the surface of the substrate via through holes provided in the polishing pad.

Alternatively, the surface of the substrate may be polished while applying voltage between the polishing pad and the substrate.

Preferably, the surface of the substrate is polished while controlling at least one of the temperature of the water or electrolytic ion water, the temperature of the substrate, and the temperature of the polishing pad.

In a preferred aspect of the present invention, a first polishing process for polishing the surface of the substrate while applying excitation light to the surface of the substrate, and a second polishing process for polishing the surface of the substrate without applying excitation light to the surface of the substrate are performed successively.

Alternatively, a first polishing process for polishing the surface of the substrate while applying excitation light to the surface of the substrate, and a second polishing process for polishing the surface of the substrate without applying excitation light to the surface of the substrate may be repeated alternately.

In a preferred aspect of the present invention, a third polishing process for polishing the surface of the substrate while applying voltage between the substrate and the polishing pad, and a forth polishing process for polishing the surface of the substrate without applying voltage between the substrate and the polishing pad are performed successively.

Alternatively, a third polishing process for polishing the surface of the substrate while applying voltage between the substrate and the polishing pad, and a forth polishing process for polishing the surface of the substrate without applying voltage between the substrate and the polishing pad are repeated alternately.

The present invention also provides a polishing apparatus for polishing a surface of a substrate made of a compound semiconductor containing either one of Ga, Al, and In, comprising a container for holding weak acid water, water with air dissolved therein, or electrolytic ion water therein, a polishing pad having an electrically conductive member in an area of a surface thereof which is held in contact with the substrate, the polishing pad being disposed in the container while being immersed in the water, a substrate holder for holding the substrate and binging the substrate into contact with the polishing pad while immersing the substrate in the water in the container, and a moving mechanism for relatively moving the polishing pad and the substrate held by the substrate holder while holding the polishing pad and the substrate in contact with each other.

The present invention provides another polishing apparatus for polishing a surface of a substrate made of a compound semiconductor containing either one of Ga, Al, and In, comprising a polishing pad having an electrically conductive member in an area of a surface thereof which is held in contact with the substrate, a substrate holder for holding the substrate and binging the substrate into contact with the polishing pad, a moving mechanism for relatively moving the polishing pad and the substrate held by the substrate holder while holding the polishing pad and the substrate in contact with each other, and a water supply section for supplying weak acid water, water with air dissolved therein, or electrolytic ion water to a contacting region of the polishing pad and the substrate held by the substrate holder.

In a preferred aspect of the present invention, the polishing pad has a number of through holes, and the polishing apparatus is configured to apply excitation light to the surface of the substrate held by the substrate holder via the through holes of the polishing pad.

In a preferred aspect of the present invention, the polishing pad has a light transmission area for applying excitation light to the surface of the substrate held by the substrate holder via a number of the through holes and a light non-transmission area, and the moving mechanism is configured to reciprocate the substrate holder between the light transmission area and the light non-transmission area on the polishing pad.

In a preferred aspect of the present invention, the polishing apparatus further comprises a conductive wire connecting the polishing pad and the substrate held by the substrate and interposing therein a power source.

The present invention provides another polishing method comprising: polishing a surface of a substrate by relatively moving a light-permeable polishing tool and the surface of the substrate while holding the light-permeable polishing tool and the surface of the substrate in contact with each other in the presence of a processing liquid; and measuring a damage level of the surface of the substrate with at least one of damage level measuring systems including a photocurrent-type damage level measuring system for measuring a damage level of the surface of the substrate by measuring the value of a current flowing through a conductive line connecting the substrate and a metal wire on the polishing tool when excitation light is applied to the surface of the substrate, a photoluminescence-light-type damage level measuring system for measuring a damage level of the surface of the substrate by measuring photoluminescence light emitted from the surface of the substrate when excitation light is applied to the surface of the substrate, and a Raman-light-type damage level measuring system for measuring a damage level of the surface of the substrate by measuring Raman light included in reflected light from the surface of the substrate when visible monochromatic light is applied to the surface of the substrate, and monitoring the progress of a polishing process based on a reduction in the damage level of the surface of the substrate.

Since at least one of the photocurrent-type damage level measuring system, the photoluminescence-light-type damage level measuring system, and the Raman-light-type damage level measuring system is used, the damage level of the surface of the substrate can be measured at the same time that the surface of the substrate is polished, and the progress of the polishing process can be monitored from a reduction in the damage level of the surface of the substrate, even if the substrate is a bare substrate, for example, which is made of only a semiconductor with no film on its surface.

The present invention provides still another polishing method comprising: forming an oxide on a surface of a substrate by applying excitation light to the surface of the substrate and simultaneously applying a bias potential to the surface of the substrate in the presence of a processing liquid; polishing away the oxide formed in the surface of the substrate by relatively moving the oxide and a polishing tool while holding the oxide and the polishing tool in contact with each other; and measuring a damage level of the surface of the substrate with at least one of damage level measuring systems including a photoluminescence-light-type damage level measuring system for measuring a damage level of the surface of the substrate by measuring photoluminescence light emitted from the surface of the substrate when excitation light is applied to the surface of the substrate, and a Raman-light-type damage level measuring system for measuring a damage level of the surface of the substrate by measuring Raman light included in reflected light from the surface of the substrate when visible monochromatic light is applied to the surface of the substrate, and monitoring the progress of a polishing process based on a reduction in the damage level of the surface of the substrate.

When the surface of the substrate is polished while forming an oxide on the surface of the substrate by applying a bias potential to the substrate, the damage level of the surface of the substrate can be measured, while at the same time the surface of the substrate is being polished, by at least one of the photoluminescence-light-type damage level measuring system and the Raman-light-type damage level measuring system, and progress of the polishing process can be monitored based on a reduction in the damage level of the surface of the substrate.

The present invention provides yet another polishing method comprising: forming an oxide on a surface of a substrate by applying excitation light to the surface of the substrate in the presence of a processing liquid; polishing away the oxide formed on the surface of the substrate by relatively moving the oxide and a polishing tool while holding the oxide and the polishing tool in contact with each other; and measuring a damage level of the surface of the substrate with at least one of damage level measuring systems including a photocurrent-type damage level measuring system for measuring a damage level of the surface of the substrate by measuring the value of a current flowing through a conductive line connecting the substrate and a metal wire on the polishing tool when excitation light is applied to the surface of the substrate, a photoluminescence-light-type damage level measuring system for measuring a damage level of the surface of the substrate by measuring photoluminescence light emitted from the surface of the substrate when excitation light is applied to the surface of the substrate, and a Raman-light-type damage level measuring system for measuring a damage level of the surface of the substrate by measuring Raman light included in reflected light from the surface of the substrate when visible monochromatic light is applied to the surface of the substrate, and monitoring the progress of a polishing process based on a reduction in the damage level of the surface of the substrate.

Preferably, the substrate is made of a semiconductor containing an element of Ga, and the processing liquid comprises a pH buffer solution of a neutral pH which contains Ga ions.

The present invention provides yet another polishing method comprising: polishing a surface of a substrate by relatively moving the surface of the substrate and a polishing tool while holding the surface of the substrate and the polishing tool in contact with each other in the presence of a processing liquid; and measuring a damage level of the surface of the substrate with a Raman-light-type damage level measuring system for measuring a damage level of the surface of the substrate by measuring Raman light included in reflected light from the surface of the substrate when visible monochromatic light is applied to the surface of the substrate, and monitoring the progress of a polishing process based on a reduction in the damage level of the surface of the substrate.

Because of the relationship to the polishing rate or the finished state of the surface such as a flatness level, there are instances where the surface of the substrate cannot be polished while excitation light is being applied to the surface of the substrate or a bias potential is being applied to the surface of the substrate. In such cases, the Raman-light-type damage level measuring system, which does not need to apply excitation light to the surface of the substrate or a bias potential to the surface of the substrate, is used to measure a damage level of the surface of the substrate while at the same time that the surface of the substrate is polished, and the progress of a polishing process can be monitored based on a reduction in the damage level of the surface of the substrate.

Preferably, the processing liquid comprises weak acid water, water with air dissolved therein, or electrolytic ion water, and an electrically conductive member is disposed on the polishing tool in an area which is held in contact with the surface of the substrate.

The present invention provides still another polishing apparatus comprising a container for holding a processing liquid therein, a light-permeable polishing tool disposed in the container while being immersed in the processing liquid, a substrate holder for holding the substrate and binging the substrate into contact with the polishing tool while immersing the substrate in the processing liquid in the container, a moving mechanism for relatively moving the polishing tool and the substrate held by the substrate holder while holding the polishing pad and the substrate in contact with each other, and at least one of damage level measuring devices including a photocurrent-type damage level measuring device for measuring a damage level of the surface of the substrate by measuring the value of a current flowing through a conductive line connecting the substrate and a metal wire on the polishing tool when excitation light is applied to the surface of the substrate, a photoluminescence-light-type damage level measuring device for measuring a damage level of the surface of the substrate by measuring photoluminescence light emitted from the surface of the substrate when excitation light is applied to the surface of the substrate, and a Raman-light-type damage level measuring device for measuring a damage level of the surface of the substrate by measuring Raman light included in reflected light from the surface of the substrate when visible monochromatic light is applied to the surface of the substrate.

The present invention provides yet another polishing apparatus comprising a light-permeable polishing tool, a substrate holder for holding the substrate and binging the substrate into contact with the polishing tool, a moving mechanism for relatively moving the polishing tool and the substrate held by the substrate holder while holding the polishing pad and the substrate in contact with each other, a processing liquid supply section for supplying a processing liquid to a contacting region of the polishing tool and the substrate held by the substrate holder, and at least one of damage level measuring devices including a photocurrent-type damage level measuring device for measuring a damage level of the surface of the substrate by measuring the value of a current flowing through a conductive line connecting the substrate and a metal wire on the polishing tool when excitation light is applied to the surface of the substrate, a photoluminescence-light-type damage level measuring device for measuring a damage level of the surface of the substrate by measuring photoluminescence light emitted from the surface of the substrate when excitation light is applied to the surface of the substrate, and a Raman-light-type damage level measuring device for measuring a damage level of the surface of the substrate by measuring Raman light included in reflected light from the surface of the substrate when visible monochromatic light is applied to the surface of the substrate.

The polishing apparatus preferably include at least one of a light source for applying excitation light to the surface of the substrate which is held by the substrate holder and immersed in the processing liquid in the container and a power source for applying a bias potential to the substrate.

The present invention provides a polishing tool comprising a light-permeable support platen with metal wires on a surface thereof and a catalyst pad having a surface which includes at least a portion held in contact with the substrate and made of a catalyst, the catalyst pad having a plurality of holes defined therein for passing therethrough at least one of light and an ion current.

Since the support platen and the catalyst pad are separate from each other and the catalyst pad has a high level of surface flatness and does not tend to produce burrs, scratches, etc., the polishing tool is capable of producing a flat polished surface free of burrs, scratches, etc. The catalyst can be replaced with a new one by replacing the catalyst pad, while allowing the support platen to be reused. Accordingly, the polishing tool is inexpensive and highly durable.

The metal wires are provided by embedding metal wires in grooves defined in the surface of the support platen, forming a metal wire pattern on the surface of the support platen, or placing a wiring film with a metal wire pattern formed thereon on the surface of the support platen, for example.

Alternatively, the metal wires may be formed by a metal film pattern deposited on the surface of the support platen by vacuum evaporation.

The support platen is preferably made of glass or light-permeable resin.

The catalyst comprises at least one of precious metal, a transition metal, a ceramics-based solid catalyst, a base solid catalyst, an acid solid catalyst, graphite, electrically conductive resin, electrically conductive rubber, and electrically conductive organic matter, for example.

The catalyst pad is made of quartz glass, for example.

Alternatively, the catalyst pad may be formed by evaporating a precious metal, a transition metal, an acid or base metal oxide film, graphite, electrically conductive resin, electrically conductive rubber, or electrically conductive organic matter on a surface of a pad base which is made of glass, rubber, light-permeable resin, foamable resin, or non-woven fabric.

The acid or base metal oxide film, which is evaporated on the surface of the pad base, is not easily peeled off from the pad base.

The present invention provides yet another polishing apparatus comprising a container for holding a processing liquid therein, the above-described polishing tool disposed in the container while being immersed in the processing liquid, a substrate holder for holding the substrate and binging the substrate into contact with the polishing tool while immersing the substrate in the processing liquid in the container, a moving mechanism for relatively moving the polishing tool and the substrate held by the substrate holder while holding the polishing pad and the substrate in contact with each other, and at least one of a light source for applying excitation light to the surface of the substrate which is held by the substrate holder and immersed in the processing liquid in the container and a power source for applying a bias potential to the substrate.

The present invention provides yet another polishing apparatus comprising the above-described polishing tool, a substrate holder for holding a substrate and binging the substrate into contact with the polishing tool, a processing liquid supply section for supplying a processing liquid to a contacting region of the polishing tool and the substrate held by the substrate holder, and at least one of a light source for applying excitation light to the surface of the substrate which is held by the substrate holder and immersed in the processing liquid in the container and a power source for applying a bias potential to the substrate.

The present invention provides another polishing tool comprising an elastic base made of at least one of elastic materials including rubber, resin, foamable resin, and non-woven fabric, an electrically conductive member disposed on the elastic base in an area held in contact with at least the substrate, and an intermediate film made of carbon or chromium interposed between the elastic base and the electrically conductive member for increasing adhesion therebetween.

Since the elastic base of elastic material is elastically deformable along the surface (polished surface) of the substrate, even if the elastic base has surface irregularities, they are prevented from being transferred to the surface of the substrate. Inasmuch as the intermediate film made of carbon or chromium is interposed between the elastic base and the electrically conductive member for increasing adhesion therebetween, the adhesion between the elastic base and the electrically conductive member is increased by the intermediate film, so that the electrically conductive member is less liable to be peeled off from the elastic base.

The elastic base preferably has grooves defined in a surface thereof for efficiently supplying the processing liquid.

The elastic base preferably has a number of through holes for passing therethrough at least one of light and an ion current.

The present invention provides yet another polishing apparatus comprising a container for holding a processing liquid therein, the above-described polishing tool disposed in the container while being immersed in the processing liquid, a substrate holder for holding the substrate and binging the substrate into contact with the polishing tool while immersing the substrate in the processing liquid in the container, and a moving mechanism for relatively moving the polishing tool and the substrate held by the substrate holder while holding the polishing pad and the substrate in contact with each other.

The present invention provides a yet another polishing apparatus comprising the above-described polishing tool, a substrate holder for holding a substrate and binging the substrate into contact with the polishing tool, a moving mechanism for relatively moving the polishing tool and the substrate held by the substrate holder while holding the polishing pad and the substrate in contact with each other, and a processing liquid supply section for supplying a processing liquid to a contacting region of the polishing tool and the substrate held by the substrate holder.

Advantageous Effects of Invention

A polishing method and a polishing apparatus according to the present invention are capable of finishing a surface of a substrate, which is made of a compound semiconductor containing an element such as Ga or the like, to a high level of flatness. By combining the finishing process with a polishing process involving the application of light and/or the application of a bias potential, i.e., by polishing the surface of the substrate at a high polishing rate with the application of light and/or the application of a bias potential, and subsequently finishing the surface of the substrate to a high level of flatness, the time required to polish the surface of the substrate, which is made of a compound semiconductor containing an element such as Ga or the like, can greatly be reduced.

According to another polishing method and the polishing apparatus of the present invention, even if the substrate is a bare substrate, for example, which is made of only a semiconductor with no film on its surface, a damage level of the surface of the substrate can be measured by a photocurrent-type damage level measuring system, a photoluminescence-light-type damage level measuring system, or a Raman-light-type damage level measuring system while at the same time the surface of the substrate is being polished, and the progress of the polishing process can be monitored.

According to a polishing toll of the present invention, since the support platen and the catalyst pad are separate from each other and the catalyst pad has a high level of surface flatness and does not tend to produce burrs, scratches, etc., the polishing tool is capable of producing a flat polished surface free of burrs, scratches, etc. The catalyst can be replaced with a new one by replacing the catalyst pad, while allowing the support platen to be reused. Accordingly, the polishing tool is inexpensive and highly durable.

Further, since the elastic base of elastic material is elastically deformable along the surface (polished surface) of the substrate, even if the elastic base has surface irregularities, they are prevented from being transferred to the surface of the substrate. Inasmuch as the intermediate film made of carbon or chromium is interposed between the elastic base and the electrically conductive member for increasing adhesion therebetween, the adhesion between the elastic base and the electrically conductive member is increased by the intermediate film, so that the electrically conductive member is less liable to be peeled off from the elastic base.

DESCRIPTION OF EMBODIMENTS

Embodiments of the present invention will be described below with reference to the drawings. In examples below, a surface of a single substrate made of GaN (GaN substrate) is polished flatwise. The present invention is applicable to a bonded substrate (epitaxial substrate) having GaN mounted on a surface of a base of sapphire or SiC or the like, and a p-type or n-type substrate which is produced by introducing an impurity (dopant) into a GaN substrate or an epitaxial substrate. The present invention is also applicable to a substrate which is produced by forming an interconnect pattern in a surface of the substrate after introducing an impurity (dopant) into a GaN substrate or an epitaxial substrate, or an activated substrate by annealing after the formation of the interconnect pattern. Furthermore, the present invention is also applicable to a compound semiconductor of GaP, GaAs, AlN, AlP, AlAs, InN, InP or InAs or the like other than GaN.

The concept of a photocurrent-type damage level measuring system for measuring a level of damage to a surface of a substrate by measuring the value of a current which flows through a conductive wire connecting the substrate and a metal wire provided on a polishing tool when the surface of the substrate is irradiated with excitation light, will be described below with reference to a schematic view of FIG. 1 and a band diagram of FIG. 2.

Figure 1:
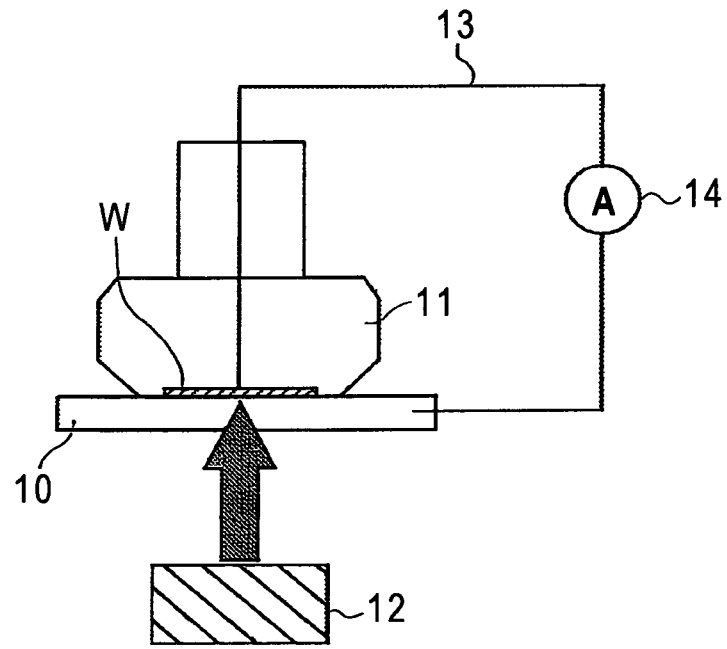
FIG. 1 is a schematic view showing the concept of a photocurrent-type damage level measuring system.
Figure 2:
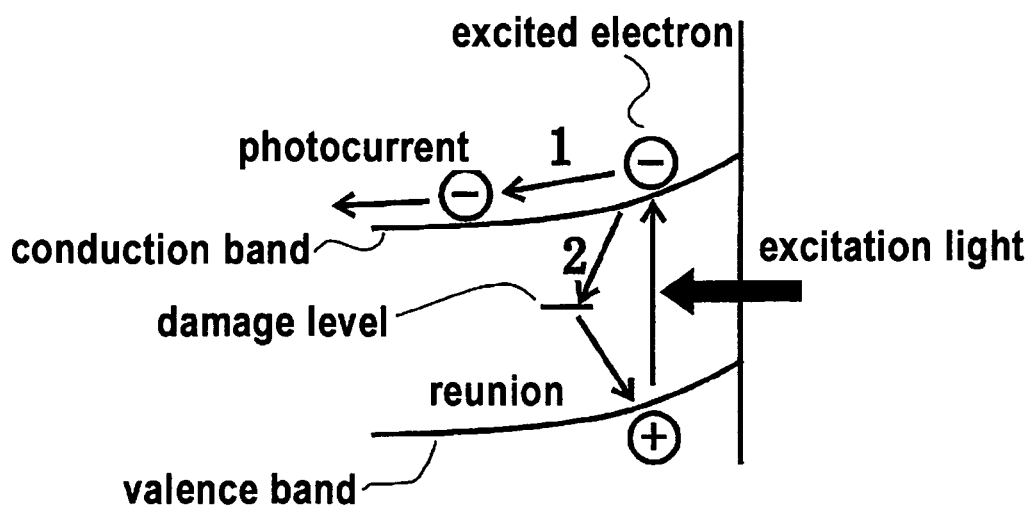
FIG. 2 is a band diagram showing the concept of the photocurrent-type damage level measuring system.

As shown in FIG. 1, in the presence of a processing liquid (not shown), a light-permeable polishing tool 10 and a surface (surface to be polished) of a substrate W made of GaN, for example, which is held by a substrate holder 11 are held in contact with each other and moved relative to each other to polish the surface (e.g., GaN surface) of the substrate W. During the polishing process, a light source 12 applies light (excitation light) having an energy higher than the band gap of the substrate (e.g., GaN) W through the polishing tool 10 to the surface of the substrate W, and an ammeter 14 measures the value of a current flowing through a conductive wire 13 connecting the substrate W and a metal wire (not shown) provided on the polishing tool 10.

The band gap of GaN, for example, is of 3.42 eV and the wavelength corresponding to the band gap is of 365 nm. Therefore, when the light source 12 applies light (excitation light) having an energy higher than the band gap of the substrate W to the surface of the substrate W, the light having a wavelength of 312 nm, for example, for polishing GaN, then as shown in FIG. 2, valence band electrons are excited to a conduction band, forming electron and hole pairs. If the level of damage to the surface of the substrate W is small, then some of the generated electrons move away from the surface of the substrate W, as indicated by the arrow 1 in FIG. 2, due to the curvature of the band on the surface of the substrate W, and flows as a photocurrent along the conductive wire 13. If the level of damage to the surface of the substrate W is large, on the other hand, then the generated electrons move along a damage level formed by the damage to the surface of the substrate W, as indicated by the arrow 2 in FIG. 2, and disappear as they are reunited with holes. Therefore, if the level of damage to the surface of the substrate W is large, then the value of a photocurrent flowing along the conductive wire 13 is small. As the level of damage to the surface of the substrate W becomes smaller, the value of a photocurrent flowing along the conductive wire 13 becomes greater. In the polishing process, it is thus possible to measure the level of damage to the surface of the substrate W to monitor the progress of the polishing process by measuring the value of the photocurrent.

Figure 3:
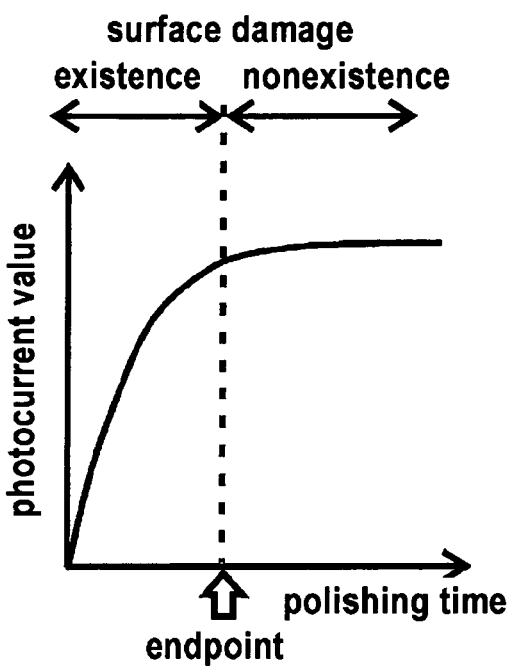
FIG. 3 is a graph showing the relationship between polishing times and photocurrent values in the photocurrent-type damage level measuring system.

As the level of damage to the surface of the substrate W is reduced when the polishing process is in progress, the value of the current flowing through the ammeter 14 increases, as shown in FIG. 3. When the damage to the surface of the substrate W is removed, the value of the current flowing through the ammeter 14 stops increasing and becomes constant. Consequently, the value of the photocurrent is measured during the polishing process, and the time at which the value of the photocurrent stops increasing and becomes constant can be regarded as an endpoint of the polishing process.

The concept of a photoluminescence-light-type damage level measuring system for measuring a level of damage to a surface of a substrate by measuring photoluminescence light emitted from the surface of the substrate when the surface of the substrate is irradiated with excitation light, will be described below with reference to a schematic view of FIG. 4 and a band diagram of FIG. 5.

Figure 4:
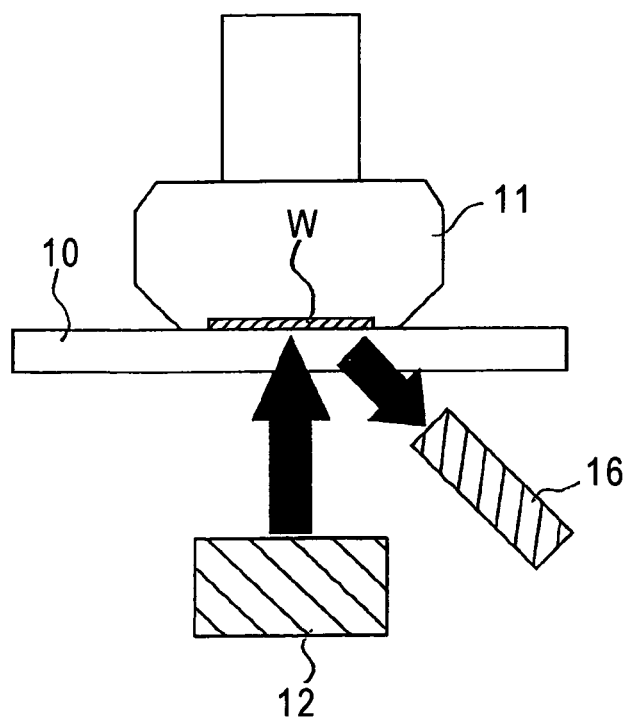
FIG. 4 is a schematic view showing the concept of a photoluminescence-light-type damage level measuring system.

As shown in FIG. 4, in the presence of a processing liquid (not shown), a light-permeable polishing tool 10 and a surface (surface to be polished) of a substrate W made of GaN, for example, which is held by a substrate holder 11 are held in contact with each other and moved relative to each other to polish the surface (e.g., GaN surface) of the substrate W. During the polishing process, a light source 12 applies light (excitation light) having an energy higher than the band gap of the substrate (e.g., GaN) W through the polishing tool 10 to the surface of the substrate W, and a spectrometer 16 performs a spectral analysis on photoluminescence light emitted from the surface of the substrate W and monitors the intensity thereof at a wavelength corresponding to the band gap of the substrate W, e.g., at the wavelength of 365 nm for GaN.

Figure 5:
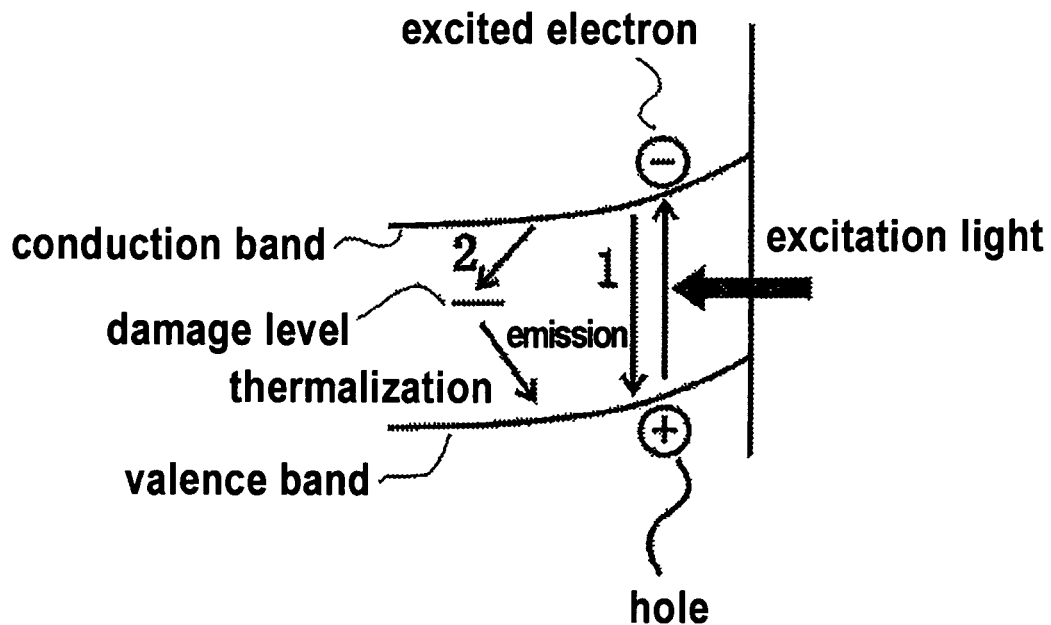
FIG. 5 is a band diagram showing the concept of the photoluminescence-light-type damage level measuring system.

When the light source 12 applies light (excitation light) having an energy higher than the band gap of the substrate W to the surface of the substrate W, as shown in FIG. 5, valence band electrons are excited to a conduction band, forming electron and hole pairs. If the level of damage to the surface of the substrate W is small, then the excited electrons directly move to the valence band and are reunited with holes, bringing back a state of equilibrium, as indicated by the arrow 1 in FIG. 5. In this process, photoluminescence light having an energy corresponding to the band gap is observed. If the level of damage to the surface of the substrate W is large, on the other hand, then the excited electrons move via an energy level developed by a loss of the crystal periodicity to the surface of the substrate W and are reunited with holes, as indicated by the arrow 2 in FIG. 5.

In the above process, the wavelength of the observed photoluminescence light is shifted toward a longer wavelength than the wavelength corresponding to the band gap, or the electrons and holes are reunited without emitting light, so that the photoluminescence light itself will not be observed. In other words, if the level of damage to the surface of the substrate W is large, then the wavelength corresponding to the band gap of the photoluminescence light is small, and as the level of damage to the surface of the substrate W becomes smaller, the wavelength corresponding to the band gap of the photoluminescence light becomes greater. In the polishing process, it is thus possible to measure the level of damage to the surface of the substrate W to monitor the progress of the polishing process by measuring the intensity of the photoluminescence light at the wavelength corresponding to the band gap of the substrate W.

Figure 6:
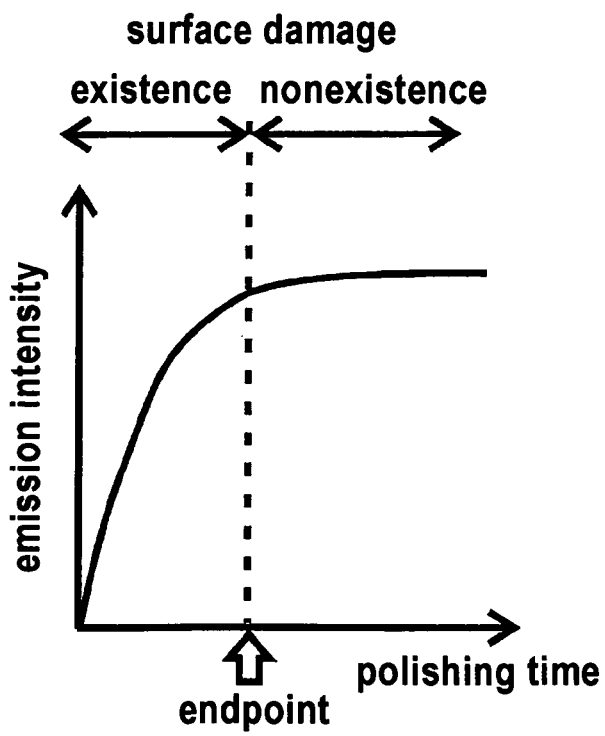
FIG. 6 is a graph showing the relationship between polishing times and photocurrent values in the photoluminescence-light-type damage level measuring system.

For example, the spectrometer 16 performs a spectral analysis on photoluminescence light emitted from the substrate W and monitors the intensity of the photoluminescence light at the wavelength (e.g., 365 nm) corresponding to the band gap of the substrate W. As the level of damage to the surface of the substrate W is reduced when the polishing process is in progress, the intensity of the light increases, as shown in FIG. 6. When the damage to the surface of the substrate W is removed, the intensity of the light stops increasing and becomes constant. Consequently, the time at which the intensity of the light stops increasing and becomes constant can be regarded as an endpoint of the polishing process.

The concept of a Raman-light-type damage level measuring system for measuring a level of damage to a surface of a substrate by measuring Raman light included in light reflected from the surface of the substrate, which is irradiated with a visible monochromatic beam, will be described below with reference to a schematic view of FIG. 7.

Figure 7:
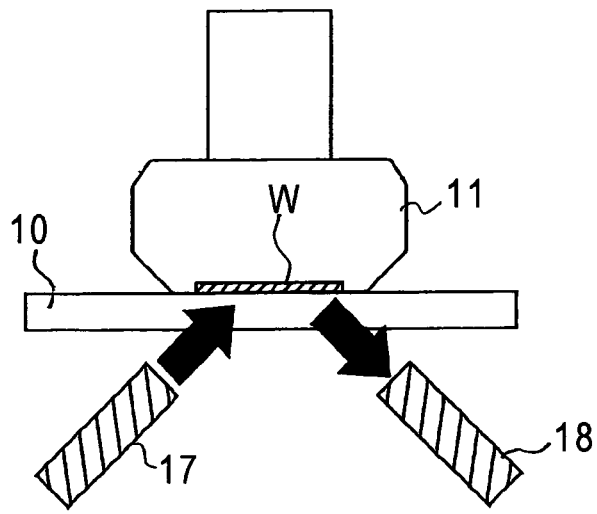
FIG. 7 is a schematic view showing the concept of a Raman-light-type damage level measuring system.

As shown in FIG. 7, in the presence of a processing liquid (not shown), a light-permeable polishing tool 10 and a surface (surface to be polished) of a substrate W made of GaN, for example, which is held by a substrate holder 11 are held in contact with each other and moved relative to each other to polish the surface (e.g., GaN surface) of the substrate W. During the polishing process, a laser beam source 17 applies a visible monochromatic beam through the polishing tool 10 to the surface of the substrate W, and a spectrometer 18 performs a spectral analysis on Raman light included in the light reflected from the surface of the substrate W.

It is known that when light having an appropriate wavelength is applied to a semiconductor substrate, the light reflected from a surface of the semiconductor substrate includes dispersed light (Rayleigh light) which has the same wavelength as the applied light and also light (Raman light) which has a wavelength slightly shifted from the wavelength of the applied light. Since the width of the shift depends on the periodicity of the crystal structure, it is known that if the level of damage to the surface of the substrate is small and the crystal structure is in order, then the width of the wavelength shift is of a value inherent with the material of the surface of the semiconductor substrate. If the level of damage to the surface of the substrate is large, then the width of the wavelength shift is varied by defects of the crystal structure. Consequently, it is possible to measure the level of damage to the surface of the substrate to monitor the progress of the polishing process by measuring the spectrum of the Raman light.

Figure 8:
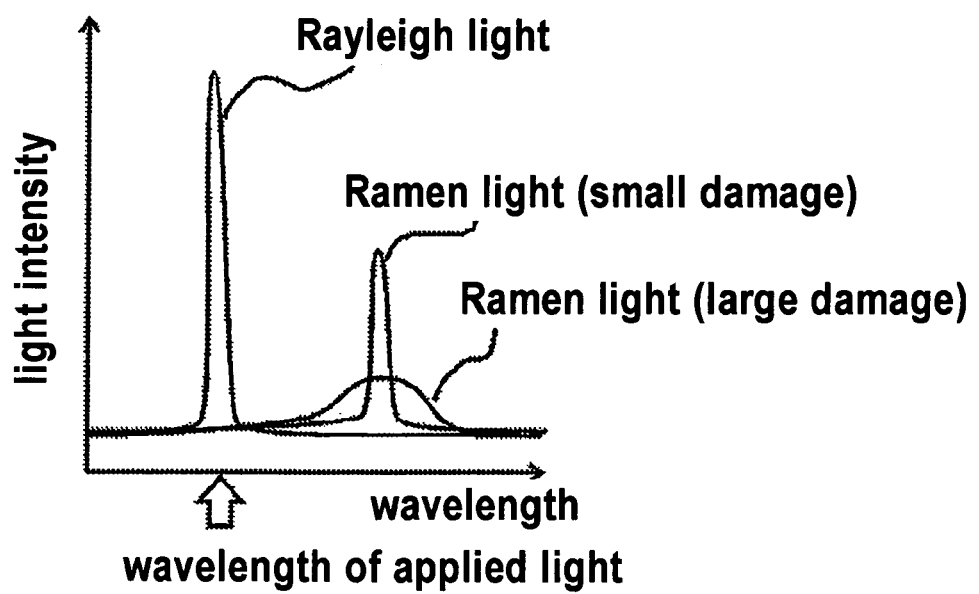
FIG. 8 is a graph showing Rayleigh light and Raman light before and after a polishing process in the Raman-light-type damage level measuring system.

For example, when the laser beam source 17 applies a visible monochromatic beam to the surface of the substrate W during the polishing process, and the spectrometer 18 performs a spectral analysis the light reflected from the surface of the substrate, Rayleigh light having the same wavelength and half bandwidth as the applied light and Raman light whose wavelength is shifted toward a longer wavelength than the applied light are measured, as shown in FIG. 8. If the level of damage to the surface of the substrate W is large, then the spectral intensity of the Raman light is reduced and the half bandwidth is increased. If the level of damage to the surface of the substrate W is small, then the spectral intensity of the Raman light is increased and the half bandwidth is reduced. It is possible to monitor the progress of the polishing process by monitoring the spectrum of the Raman light during the polishing process. The time at which the intensity or half bandwidth of the Raman light stops changing can be regarded as an endpoint of the polishing process.

Figure 9:
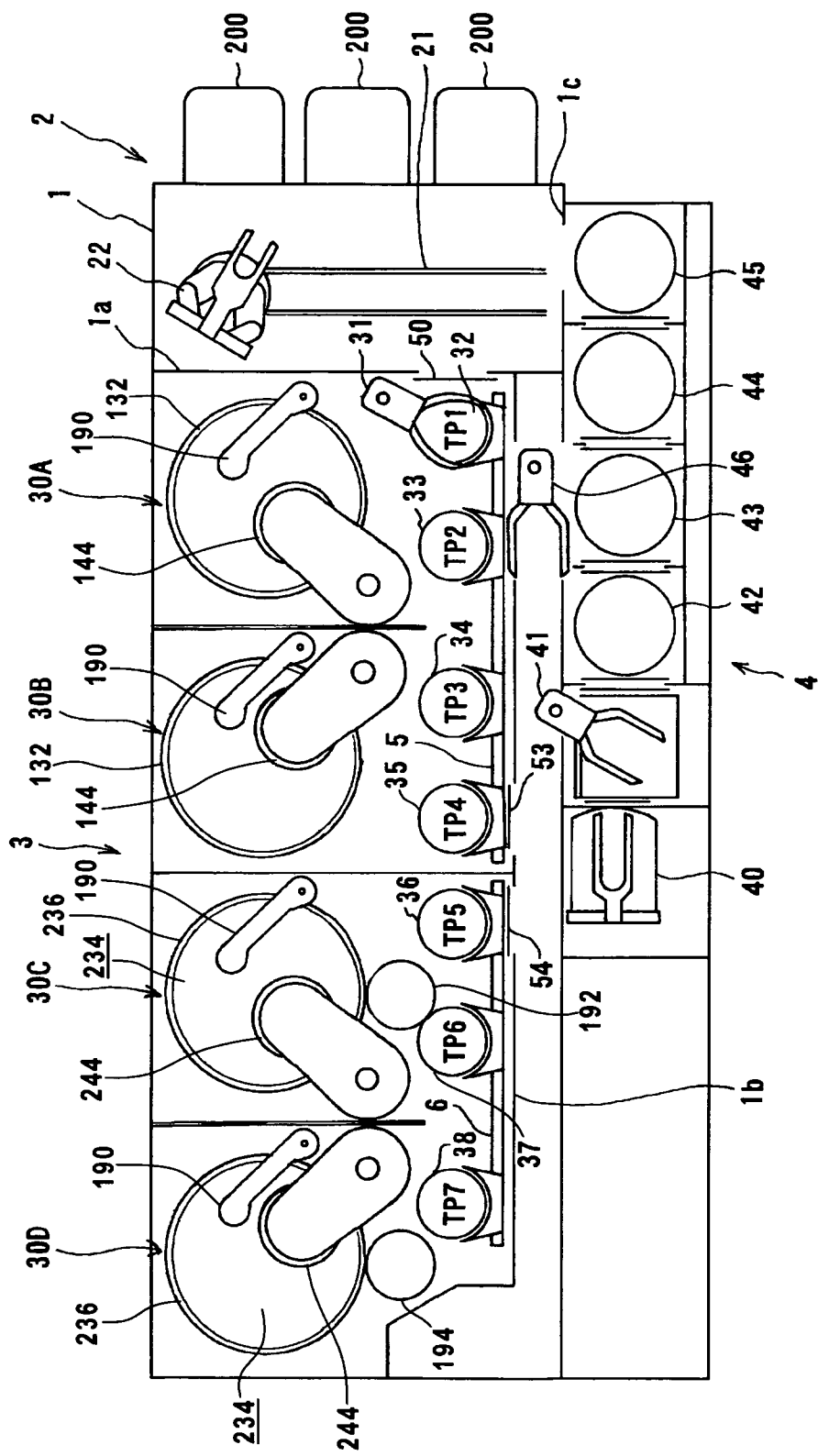
FIG. 9 is a plan view showing the overall construction of a flattening system incorporating a polishing apparatus according to an embodiment of the present invention.

FIG. 9 is a plan view showing the overall construction of a flattening system incorporating a polishing apparatus according to an embodiment of the present invention. This flattening system is used for polishing a surface of a GaN substrate to flatten the surface. As shown in FIG. 9, this flattening system includes a substantially rectangular housing 1 whose interior is divided by partition walls 1a, 1b, 1c into a loading/unloading section 2, a polishing section 3 and a cleaning section 4. The loading/unloading section 2, the polishing section 3 and the cleaning section 4 are independently fabricated and independently evacuated.

The loading/unloading section 2 includes at least one (e.g., three as shown) front loading section 200 on which a substrate cassette, storing a number of substrates (objects to be polished) therein, is placed. The front loading sections 200 are arranged side by side in the width direction (perpendicular to the long direction) of the flattening system. Each front loading section 200 can receive thereon an open cassette, a SMIF (standard manufacturing interface) pod or a FOUP (front opening unified pod). The SMIF and FOUP are a hermetically sealed container which can house a substrate cassette therein and can keep the interior environment independent of the exterior environment by covering with a partition.

A moving mechanism 21, extending along the line of the front loading sections 200, is provided in the loading/unloading section 2. On the moving mechanism 21 is provided a first transfer robot 22 as a first transfer mechanism, which is movable along the direction in which substrate cassettes are arranged. The first transfer robot 22 can reach the substrate cassettes placed in the front loading sections 200 by moving on the moving mechanism 21. The first transfer robot 22 has two hands, an upper hand and a lower hand, and can use the two hands differently, for example, by using the upper hand when returning a processed substrate to a substrate cassette and using the lower hand when transferring an unprocessed substrate.

The loading/unloading section 2 is an area that needs to be kept in the cleanest environment. Accordingly, the interior of the loading/unloading section 2 is constantly kept at a higher pressure than any of the outside of the apparatus, the polishing section 3 and the cleaning section 4. Furthermore, a filter-fan unit (not shown) having an air filter, such as an HEPA filter or a ULPA filter, is provided above the moving mechanism 21 for the first transfer robot 22. Clean air, from which particles, vapor and gas have been removed, continually blows off downwardly through the filter-fan unit.

The polishing section 3 is an area where polishing of a surface (surface to be processed) of a substrate is carried out. The polishing 3 includes two polishing apparatuses 30A, 30B which carry out polishing at a first stage and polishing at a second stage successively and two polishing apparatuses 30C, 30D which carry out polishing at a third stage. The polishing apparatuses 30A through 30D are arranged along the long direction of the flattening system.

Figure 10:
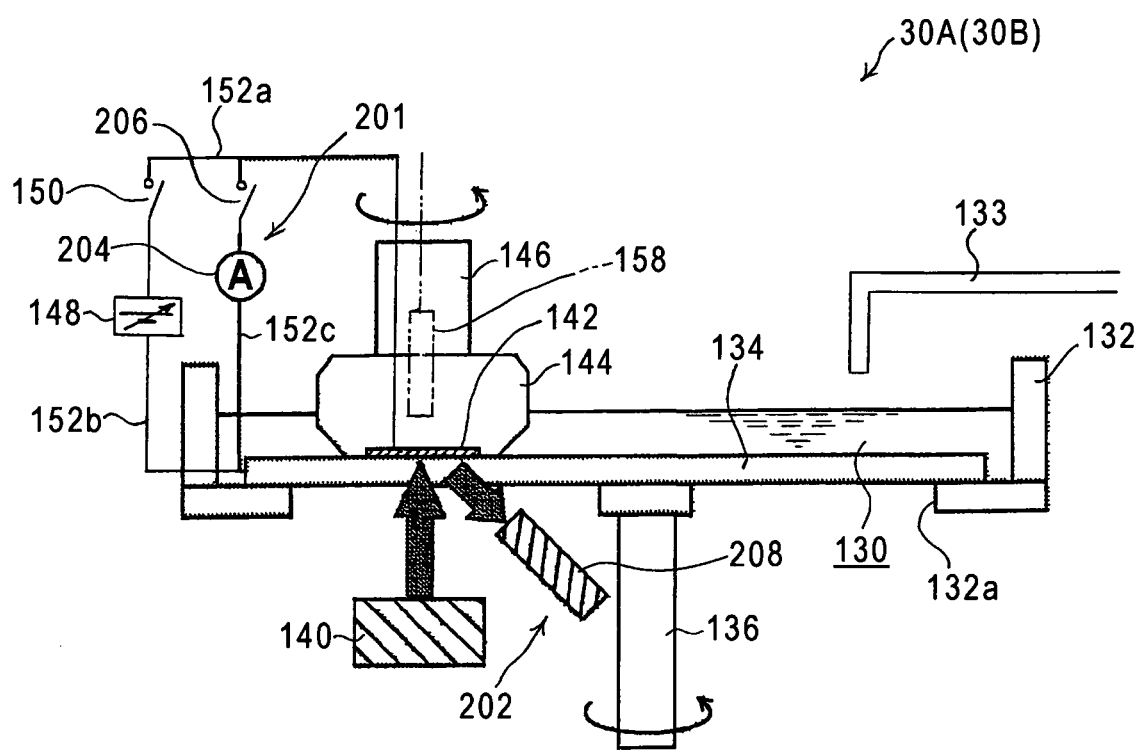
FIG. 10 is a schematic cross-sectional view of the polishing apparatus incorporated in the flattening system shown in FIG. 9.

As shown in FIG. 10, the polishing apparatuses 30A, 30B each includes a container 132 for holding therein a processing liquid (polishing solution) 130 comprising a neutral pH buffer solution containing Ga ions. Above the container 132 is disposed a processing liquid supply nozzle 133 for supplying the processing liquid 130 into the container 132. As the processing liquid 130 may be used a solution which is prepared by adding Ga ions, e.g., in an amount of not less than 10 ppm, to a phosphate buffer solution, e.g., having a pH of 6.86 to bring Ga ions in the processing liquid 130 near to saturation. The pH of the neutral pH buffer solution (at 25° C.) is, for example, 6.0 to 8.0.

A polishing tool (polishing platen) 134 having light permeability is mounted on the bottom of the container 132, so that the polishing tool 134 becomes immersed in the processing liquid 130 when the container 132 is filled with the processing liquid 130. The polishing tool 134 is, for example, composed of quartz glass which is an acid solid catalyst having excellent light permeability. It is possible to use a basic solid catalyst for the polishing tool 134. Further, it is possible to use one having an acidic or basic solid catalyst layer only in a surface of the polishing tool 134.

The container 132 is coupled to an upper end of a rotatable rotating shaft 136. The bottom plate of the container 132 has a ring-shaped opening 132a formed around the rotating shaft 136 and closed by the polishing tool 134. A light source 140 for emitting excitation light, preferably ultraviolet light, is disposed right below the opening 132a. Thus, the excitation light, preferably ultraviolet light, emitted from the light source 140, passes through the opening 132a of the container 132, permeates through the interior of the polishing tool 134 and reaches above the polishing tool 134.

Right above the container 132 is disposed a substrate holder 144 for detachably holding a substrate 142, e.g., a GaN substrate, with a front surface facing downwardly. The substrate holder 144 is coupled to a lower end of a main shaft 146 that is rotatable and vertically movable. In this embodiment, the rotating shaft 136 for rotating the container 132 and the main shaft 146 for rotating the substrate holder 144 constitute a movement mechanism for moving the polishing tool 134 and the substrate (GaN substrate) 142, held by the substrate holder 144, relative to each other. However, it is also possible to provide only one of them.

The polishing apparatus of this embodiment is also provided with a power source 148 for applying a voltage between the substrate 142, held by the substrate holder 144, and the polishing tool 134. A switch 150 is interposed in a conductive wire 152a extending from the positive pole of the power source 148.

In this embodiment, processing of the substrate 142 is carried out in an immersion manner: the container 132 is filled with the processing liquid 130 and the polishing tool 134 and the substrate 142 held by the substrate holder 144 are kept immersed in the processing liquid 130 during processing. It is also possible to employ a dripping manner in which the processing liquid 130 is supplied between the substrate 142 and the polishing tool 134 by dripping the processing liquid 130 from the processing liquid supply nozzle 133 onto the surface of the polishing tool 134, so that processing of the substrate 142 is carried out in the presence of the processing liquid 130.

Figure 11:
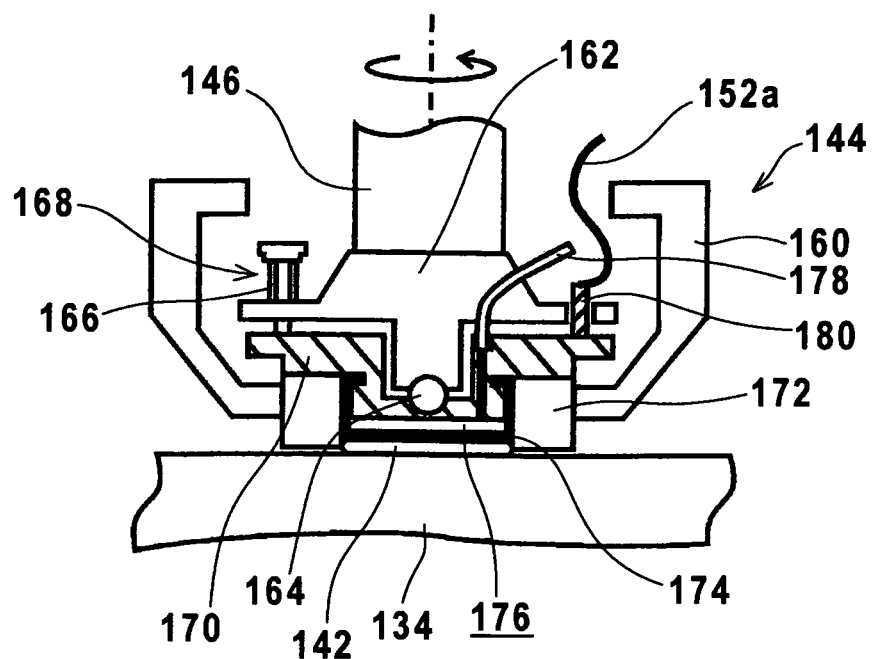
FIG. 11 is an enlarged cross-sectional view of a substrate holder of the polishing apparatus shown in FIG. 10.

As shown in FIG. 11, the substrate holder 144 has a cover 160 for preventing intrusion of the processing liquid 130. Inside the cover 160, a metal holder body 170 is coupled, via a rotation transmission section 168 including a universal joint 164 and a spring 166, to a drive flange 162 that is coupled to the lower end of the main shaft 146.

A retainer ring 172 is vertically movably disposed around the lower portion of the holder body 170. A conductive rubber 174 is mounted to a lower surface (substrate holding surface) of the holder body 170 such that a pressure space 176 can be formed between the lower surface of the holder body 170 and the conductive rubber 174. An air introduction pipe 178 is connected to the pressure space 176 via an air introduction passage extending in the holder body 170. The flange portion of the metal holder body 170 is provided with an extraction electrode 180 to which is connected the conductive wire 152a extending from the positive pole of the power source 148.

In order to prevent wear of the surface of the retainer ring 172 by making into contact with the polishing tool 134 to thereby prevent the surface material of the retainer ring 172 from adhering to the surface of the polishing tool 134, at least the surface portion of the retainer ring 172, which comes into contact with the polishing tool 134, is preferably made of a glass material, such as quartz, sapphire or zirconia, or a ceramic material such as alumina, zirconia or silicon carbide. The conductive rubber 174 is, for example, a conductive chloroprene rubber, a conductive silicone rubber or a conductive fluororubber.

When the back surface of the substrate 142 is held, e.g., by attraction, on the lower surface (substrate holding surface) of the holder body 170 of the substrate holder 144, the conductive rubber 174 comes into contact with the back surface of the substrate 142 to feed electricity to the back surface. While maintaining the electricity feeding to the back surface of the substrate 142, air can be introduced into the pressure space 176 so as to press the substrate 142 against the polishing tool 134.

The substrate holder 144 can thus hold the substrate 142 while feeding electricity to the substrate 142 in a simple manner at a low resistance. The substrate holder 144 is preferably configured to be capable of filling a polar conductive grease between the conductive rubber 174 and the substrate 142 when bringing the substrate 142 into contact with the conductive rubber 174 upon holding of the substrate 142 on the substrate holder 144.

Figure 12:
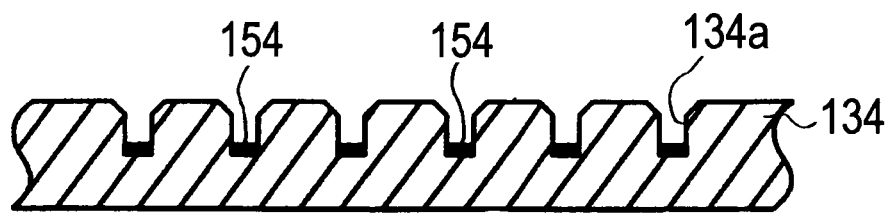
FIG. 12 is an enlarged cross-sectional view of a polishing tool of the polishing apparatus shown in FIG. 10.
Figure 13:
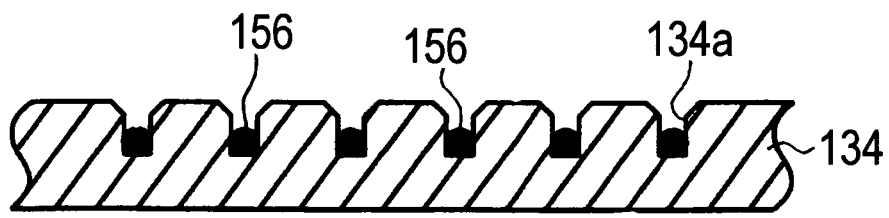
FIG. 13 is an enlarged cross-sectional view of another polishing tool.

As shown in FIG. 12, a large number of grooves 134a are provided in an upper surface of the polishing tool 134 in an area corresponding to the opening 132a of the container 132. Vapor-deposited metal films 154 comprising metal wires are formed in bottoms of the grooves 134a. To the metal films 154 is connected a conductive wire 152b extending from the negative pole of the power source 148. The metal films 154 are preferably made of platinum or gold, which is corrosion-resistant. Though the grooves 134a provided in the upper surface of the polishing tool 134 are preferably arranged in concentric circles, it is also possible to arrange the grooves in a spiral, radial or lattice-shaped configuration. As shown in FIG. 13, it is also possible to provide metal wires (metal wires) 156 of, e.g., gold or platinum in the bottoms of the grooves 134a provided in the upper surface of the polishing tool 134.

A heater 158 (see FIG. 10), embedded in the substrate holder 144 and extending into the main shaft 146, is provided as a temperature control mechanism for controlling the temperature of the substrate 142 held by the substrate holder 144. A heat exchanger as a temperature control mechanism for controlling the processing liquid 130 to be supplied into the container 132 at a predetermined temperature is provided to the processing liquid supply nozzle 133 disposed above the container 132, as necessary. Furthermore, a fluid passage (not shown) as a temperature control mechanism for controlling the temperature of the polishing tool 134 is provided in the interior of the polishing tool 134.

As is known by the Arrhenius equation, the higher the reaction temperature of a chemical reaction is, the higher is the reaction rate. Thus, by controlling at least one of the temperature of the substrate 142, the temperature of the processing liquid 130 and the temperature of the polishing tool 134 so as to control the reaction temperature, the processing rate can be adjusted and the stability of the processing rate can be enhanced.

As shown in FIG. 9, the polishing apparatuses 30A, 30B are each provided with a conditioning mechanism (conditioner) 190, e.g., comprised of a polishing pad, for conditioning the surface (upper surface) of the polishing tool 134 so that it has desired flatness and appropriate roughness. The surface (upper surface) of the polishing tool 134 is conditioned by the conditioning mechanism (conditioner) 190 so that it has a PV (peak-to-valley) roughness of the surface of about 0.1 to 1 µm. During the conditioning of the polishing tool 134, an abrasive-containing slurry may be supplied to the surface of the polishing tool 134, as necessary.

As shown in FIG. 10, the polishing apparatus 30A, 30B each includes a photocurrent-type damage level measuring device 201 having the light source 140 as a component thereof and a photoluminescence-light-type damage level measuring device 202 also having the light source 140 as a component thereof. The photocurrent-type damage level measuring device 201 comprises a conductive wire 152c which connects the conductive wire 152a extending from the power source 148 and connected to the substrate 142 held by the substrate holder 144 and the conductive wire 152b extending from the power source 148 and connected to the metal films (metal wires) 154 of the polishing tool 134, an ammeter 204 connected to the conductive wire 152c, and the light source 140. The conductive wire 152c has a switch 206. The photoluminescence-light-type damage level measuring device 202 comprises a spectrometer 208 for performing a spectral analysis on photoluminescence light reflected from the surface of the substrate 142 to measure the intensity of the photoluminescence light having a wavelength (e.g., 365 nm) corresponding to the band gap of the substrate W, and the light source 140.

In this embodiment, the light source 140 for applying excitation light to the substrate 142 to oxidize the surface of the substrate 142 is used as respective light sources of the photocurrent-type damage level measuring device 201 and the photoluminescence-light-type damage level measuring device 202. However, the photocurrent-type damage level measuring device 201 and the photoluminescence-light-type damage level measuring device 202 may have respective dedicated light sources separately from the light source 140.

Figure 14:
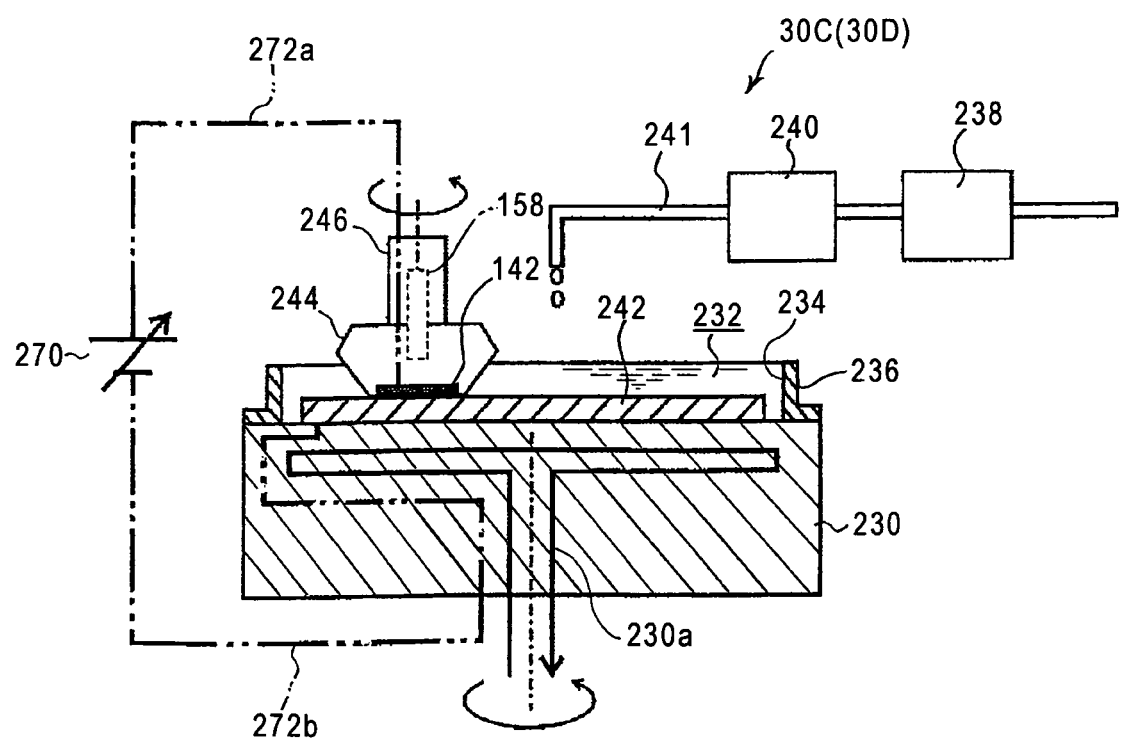
FIG. 14 is a schematic cross-sectional view of the polishing apparatus incorporated in the flattening system shown in FIG. 9.

As shown in FIG. 14, the polishing apparatus 30C, 30D each includes a rotatable turntable 230 having a flat upper surface and a ring-shaped dam member 236 mounted on the peripheral edge of the turntable 230 and providing a container 234 for holding water 232 therein on the upper surface of the turntable 230. The water 232 may comprise weak acid water, water with air dissolved therein, or electrolytic ion water. The weak acid water or water with air dissolved therein has a pH in the range from 3.5 to 6.0 or preferably from 3.5 to 5.5. The electrolytic ion water has a pH in the range from 3.5 to 6.0 or preferably from 3.5 to 5.5 or of 8.0 or higher.

The weak acid water, which has a pH in the range from 3.5 to 6.0, is manufactured by dissolving a $CO_2$ gas or $CO_2$ in air into pure water or tap water, for example, without the addition of an acid, a pH buffer, or an oxidizer ($H_2O_2$, ozone water, persulfate, or the like). When the weak acid water, which has a pH in the range from 3.5 to 6.0 that is produced without the addition of an acid, a pH buffer, or an oxidizer, is used, the substrate 142 can be polished at a polishing rate that is kept against being lowered, while the surface thereof (surface to be polished) is prevented from developing etch pits. Since this process does not involve chemicals, such as an acid, a pH buffer, and an oxidizer, which need to be processed by a waste liquid treatment, the process is advantageous in that the cost of the waste liquid treatment is dispensed with and a cleaning process subsequent to the polishing process is simplified.

In this embodiment, a water supply line (water supply section) 241 extending from a pure water supply source (not shown) and having a gas dissolver 238 and a heat exchanger 240 is disposed above the turntable 230. The gas dissolver 238 dissolves a gas of $CO_2$ or the like or air into pure water delivered from the pure water supply source to produce water 232 whose pH is adjusted to 3.5 to 6.0, or preferably 3.5 to 5.5, which is introduced into the container 234 provided by the dam member 236. If necessary, the water 232 to be introduced into the container 234 is adjusted to a prescribed temperature by the heat exchanger 238. In an initial stage of the polishing process, pure water or tap water may be introduced, and the substrate 142 may be polished in an air atmosphere, so that $CO_2$ in air may be dissolved into pure water or tap water at the same time that the substrate 142 is polished, adjusting the pH of the water to 3.5 to 6.0, or preferably 3.5 to 5.5.

Though in this embodiment the water 232 having a pH of 3.5-6.0, preferably 3.5-5.5, by dissolving a gas of $CO_2$ or the like or air into pure water is used, neutral $N_2$-purged water that is produced by purging $N_2$ into tap water or pure water may be used instead of the water 232. When the neutral $N_2$-purged water is used, the processing rate decrease while obtaining an equal processed surface as compared with the case where the water 232 having a pH of 3.5-6.0, preferably 3.5-5.5, is used.

A polishing pad 242 serving as a polishing member is mounted on the upper surface of the turntable 230 at a position within the container 234 whose periphery is defined by the dam member 236. When the water 232 is introduced into the container 234, the space above the polishing pad 242 is filled with the water 232. The turntable 230 has a fluid passage 230a defined therein for controlling the temperature of the turntable 230.

The substrate 142, such as a GaN substrate or the like, is detachably held, with its surface facing downward, by a substrate holder 244 disposed above the container 234 whose periphery is defined by the dam member 236. The substrate holder 244 is connected to the lower end of a main shaft 246 which is vertically movable and rotatable about its own axis. The substrate holder 244 and the main shaft 246 are identical in structure to the substrate holder 144 and the main shaft 146 shown in FIG. 10, and will not be described in detail below.

Figure 15:
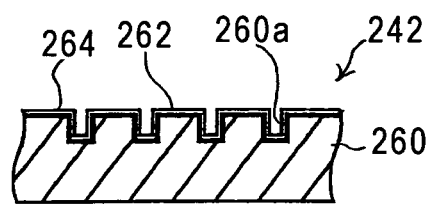
FIG. 15 is an enlarged cross-sectional view of a polishing pad of the polishing apparatus shown in FIG. 14.

As shown in FIG. 15, the polishing pad 242 comprises an elastic base 260 made of an elastic material, e.g., having a Shure hardness in the range from 50 to 90 and including concentric or spiral grooves 260a defined in a surface thereof for effectively supplying the processing liquid (water) 232, an intermediate layer 262 deposited on the surface of the elastic base 260 by vacuum evaporation or the like, and an electrically conductive member 264 deposited on a surface of the intermediate layer 262 by vacuum evaporation or the like. The electrically conductive member 264 that is disposed on the surface of the elastic base 260 with the intermediate layer 262 interposed therebetween finds it easy to follow irregularities in long/single periods on the surface (surface to be polished) of the substrate 142. The elastic base 260 may have holes for effectively supplying the processing liquid (water), rather than the grooves 260a.

The elastic base 260 has a thickness in the range from 0.5 to 5 mm, for example. The elastic material of the elastic base 260 may be rubber, resin, foamable resin, non-woven fabric or the like, for example. The elastic base 260 may comprise two or more superposed layers of elastic material which have different moduli of elasticity.

The intermediate layer 262 has a thickness in the range from 1 to 10 nm, for example. The intermediate layer 262 is interposed between the elastic base 260 and the electrically conductive member 264 in order to increase the adhesion between the elastic base 260 and the electrically conductive member 264, and is made of chromium or graphite (SP2-bonded) carbon, for example, which is characterized by better adhesion to both the elastic base 260 and the electrically conductive member 264. When the intermediate layer 262 is formed on the surface of the elastic base 260 by vacuum evaporation, it is preferable to employ ion sputtering deposition in order to suppress expansion and modification of the elastic base 260 due to high temperatures. This holds true also when the electrically conductive member 264 is formed on the surface of the intermediate layer 262 by vacuum evaporation.

The electrically conductive member 264 has a thickness in the range from 100 to 1000 nm, for example. If the thickness is smaller than 100 nm, then the electrically conductive member 264 will be unduly worn when the polishing process is carried out for about one hour, and hence is not practical. If the thickness is greater than 1000 nm, then the surface of the electrically conductive member 264 will tend to crack when the polishing process is carried out. The electrically conductive member 264 is preferably made of platinum, but may be made of any of precious metals such as gold, transition metals (Ag, Fe, Ni, Co, etc.), graphite, electrically conductive resin, electrically conductive rubber, electrically conductive organic matter etc. which are insoluble or slightly soluble (at a solving rate of 10 nm/h. or lower) in the water 232. If the electrically conductive member is made of a transition metal, then it is preferable to use, as the supplied water, water (hydrogen water) in which there is dissolved hydrogen generated at a cathode when pure water or tap water is electrolyzed, thereby preventing the electrically conductive member from being corroded by oxygen dissolved in the water.

As is known from the Arrhenius equation, a chemical reaction has a higher reaction rate as the reaction temperature is higher. Therefore, it is possible to increase the stability of the reaction rate while varying the reaction rate, by controlling at least one of the temperatures of the substrate 142, the water 232, and the turntable 230 to control the reaction temperature.

As shown in FIG. 9, the polishing apparatus 30C, 30D each includes the conditioning mechanism (conditioner) 190, which may comprise a polishing pad, for example, for conditioning the surface (upper surface) of the polishing tool 134 to a good level of flatness and an appropriate level of roughness.

The polishing apparatuses 30C, 30D are each capable of polishing the surface of the substrate 142 by holding the surface of the substrate 142 and the electrically conductive member 264, such as of platinum or the like, of the polishing pad 242 in contact with each other and moving them relative to each other while the substrate 142 held by the substrate holder 244 and the polishing pad 242 are being immersed in the water 232. The surface of the substrate 142 may be polished while the water 232 is being interposed between the substrate 142 held by the substrate holder 244 and the polishing pad 242 by supplying the water 232 from the water supply line 241 onto the upper surface of the polishing pad 242.

The mechanism of the polishing process is considered as follows: When the surface of the substrate 142 and the electrically conductive member 264, such as of platinum or the like, of the polishing pad 242 are held in contact with each other and moved relative to each other, the contacting region is strained to excite valence band electrons to a conduction band, generating electron and hole pairs. The electrons excited to the conduction band are moved to the electrically conductive member 264, such as of platinum or the like, which has a large work function, leaving holes on the substrate surface. $OH^-$ ions or $H_2O$ molecules in the water 232 act on the left holes, resulting the oxidization of only the contacting region. Since oxides of Ga, Al, and In are dissolvable in a weak acid such as a carbon dioxide solution or the like or a weak alkali, the oxides produced in the contacting region are dissolved into the water 232 and removed from the surface of the substrate 142.

The pressure under which the surface of the substrate 142 and the electrically conductive member 264, such as of platinum or the like, of the polishing pad 242 are held in contact with each other should preferably be in the range from 0.1 to 1.0 kgf/cm$^2$, for example, and particularly should preferably be of about 0.4 kgf/cm$^2$, in order to eliminate any warpage of the substrate 142 and prevent the substrate 142 from being slipped out and the electrically conductive member 264 of the polishing pad 242 from being peeled off from the base 260.

Figure 16:
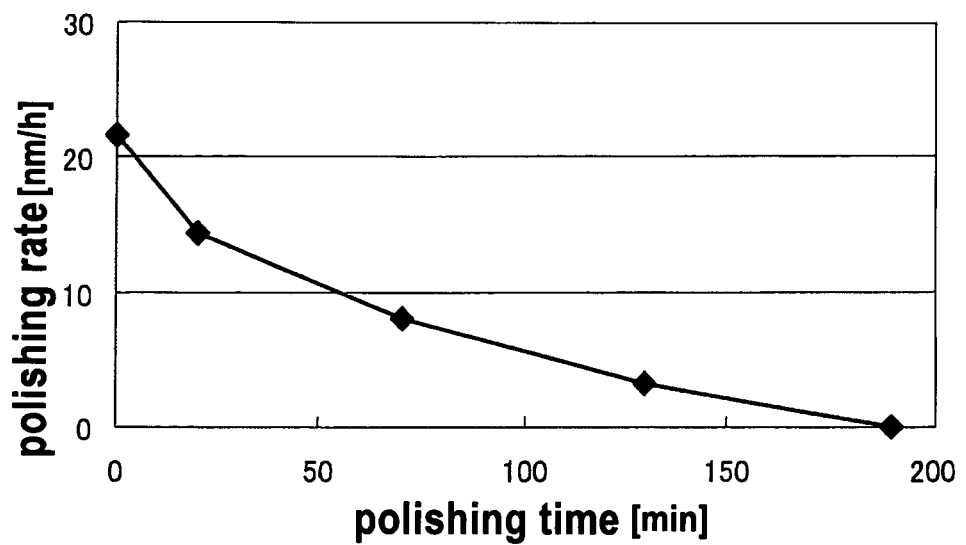
FIG. 16 is a graph showing the relationship between polishing rates and polishing times when a GaN substrate is polished by the polishing apparatus shown in FIG. 14.

FIG. 16 shows the relationship between polishing rates and polishing times when a GaN substrate is polished by the polishing apparatus shown in FIG. 14, which employs pure water with air dissolved therein as the water 232 and a polishing pad evaporated platinum thereon as the polishing pad 242. As can be seen from FIG. 16 that though the polishing rate is about 22 nm/h at the start of the polishing process, the polishing rate gradually decrease as the polishing process progresses, and the polishing rate becomes almost 0 nm/h at the end of the polishing process. In this regard, it is conceivable that the polishing rate is high when there are large volume of material to be removed in such a state that a surface is roughen at the start of the polishing process, and the polishing rate becomes lower as the surface is flatten and the material to be removed by polishing process is decrease.

Both the elastic base 260 and the intermediate layer 262 of the polishing pad 242 may be made of an electrically conductive material, and, as indicated by the imaginary lines in FIG. 14, a conductive wire 272a extending from the anode of a power source 270 and a conductive wire 272b extending from the cathode thereof may be connected respectively to the substrate 142 held by the substrate holder 244 and the elastic base 260 of the polishing pad 242. Then, the surface of the substrate 142 may be polished while a voltage is being applied between the electrically conductive member 264 of the polishing pad 242 and the substrate 142 held by the substrate holder 244. In this manner, the polishing rate can be increased.

Returning to FIG. 9, between the polishing apparatuses 30A, 30B and the cleaning section 4 is disposed a first linear transporter 5 as a first (translatory) transfer mechanism for transferring a substrate between four transferring positions (a first transferring position TP1, a second transferring position TP2, a third transferring position TP3, and a fourth transferring position TP4 in the order of distance from the loading/unloading section 2) along the long direction of the flattering system. A reversing machine 31 for reversing a substrate received from the first transfer robot 22 is disposed above the first transferring position TP1 of the first linear transporter 5, and a vertically-movable lifter 32 is disposed below the reversing machine 31. Further, a vertically-movable pusher 33 is disposed below the second transferring position TP2, a vertically-movable pusher 34 is disposed below the third transferring position TP3, and a vertically-movable lifter 35 is disposed below the fourth transferring position TP4.

Beside the polishing apparatuses 30C, 30D and adjacent to the first linear transporter 5 is disposed a second linear transporter 6 as a second (translatory) transfer mechanism for transferring a substrate between three transferring positions (fifth transferring position TP5, sixth transferring position TP6 and seventh transferring position TP7 in order of distance from the loading/unloading section 2) along the long direction of the flattering system. A vertically-movable lifter 36 is disposed below the fifth transferring position TP5, a pusher 37 is disposed below the sixth transferring position TP6, and a pusher 38 is disposed below the seventh transferring position TP7. Further, a pure water replacement section 192 including a tub and a pure water nozzle is disposed between the polishing apparatus 30C and the pusher 37, and a pure water replacement section 194 including a tub and a pure water nozzle is also disposed between the polishing apparatus 30D and the pusher 38.

As will be understood from the use of a slurry or the like during polishing, the polishing section 3 is the dirtiest area. In this system, therefore, discharge of air is performed around a removal processing site, such as a platen, so as to prevent particles in the polishing section 3 from flying to the outside. Further, the internal pressure of the polishing section 3 is made lower than the external pressure of the system and the internal pressures of the neighboring cleaning section 4 and loading/unloading section 2, thereby preventing particles from flying out. An exhaust duct (not shown) and a filter (not shown) are usually provided respectively below and above a removal processing site, such as a platen, so as to create a downward flow of cleaned air.

The cleaning section 4 is an area for cleaning a substrate. The cleaning section 4 includes a second transfer robot 40, a reversing machine 41 for reversing a substrate received from the second transfer robot 40, three cleaning units 42-44 each for cleaning the substrate, a drying unit 45 for rinsing the cleaned substrate with pure water and then spin-drying the substrate, and a movable third transfer robot 46 for transferring the substrate between the reversing machine 41, the cleaning units 42-44 and the drying unit 45. The second transfer robot 40, the reversing machine 41, the cleaning units 42-44 and the drying unit 45 are arranged in a line along the long direction of the flattering system, and the third transfer robot 46 is movably disposed between the first linear transporter 5 and the line of the second transfer robot 40, the reversing machine 41, the cleaning units 42-44 and the drying unit 45. A filter-fan unit (not shown) having an air filter is provided above the cleaning units 42-44 and the drying unit 45, and clean air, from which particles have been removed by the filter-fan unit, continually blows downward. The interior of the cleaning section 4 is constantly kept at a higher pressure than the polishing section 3 to prevent inflow of particles from the polishing section 3.

A shutter 50, located between the reversing machine 31 and the first transfer robot 22, is provided in the partition wall 1a surrounding the polishing section 3. The shutter 50 is opened when transferring a substrate between the first transfer robot 22 and the reversing machine 31. Further, a shutter 53 located at a position facing the polishing apparatus 30B and a shutter 54 located at a position facing the polishing apparatus 30C are respectively provided in the partition wall 1b surrounding the polishing section 3.

Processing for flattening a surface of a substrate by the flattening system having the above construction will now be described.

The first transfer robot 22 carries a substrate out of the substrate cassette placed in the front loading section 200 and transfers the substrate to the reversing machine 31. The reversing machine 31 reverses the substrate through 180° and then places the reversed substrate on the lifter 32 at the first transferring position TP1. The first linear transporter 5 moves to transfer the substrate on the lifter 32 to the first transferring position TP1 or the third transferring position TP3. The substrate holder 144 of the polishing apparatus 30A receives the substrate from the pusher 32 or the substrate holder 144 of the polishing apparatus 30B receives the substrate from the pusher 34. Then, the polishing apparatus 30A or 30B polishes the surface of the substrate in a first stage and a second stage.

Specifically, in the polishing apparatus 30A, the substrate holder 144 which is holding the substrate 142 such as a GaN substrate or the like with its surface (surface to be processed) facing downward is moved to a position above the container 132, and then is lowered to immerse the substrate 142 in the processing liquid 130 held in the container 132. While the processing liquid 130 is present between the substrate 142 and the polishing tool 134, the light source 140 applies excitation light, preferably ultraviolet light, to the surface (lower surface) of the substrate 142. If the substrate 142 comprises a GaN substrate, then since the band gap of GaN is of 3.42 eV, the excitation light should preferably have a wavelength equal to or lower than the wavelength corresponding to the band gap of the workpiece, i.e., equal to or lower than 365 nm, e.g., should preferably have a wavelength of 312 nm. When the GaN substrate is machined, therefore, GaN is oxidized to form a Ga oxide ($Ga_2O_3$) on the surface of the GaN substrate.

The substrate 142 may be polished while the processing liquid 130 is being supplied through the processing liquid supply nozzle 133 between the substrate 142 and the polishing tool 134.

At this time, the switch 150 of the power source 148 is turned on to apply a voltage between the polishing tool 134 and the substrate 142 held by the substrate holder 144 such that the polishing tool 134 serves as a cathode. When the GaN substrate is processed, therefore, the formation of the Ga oxide ($Ga_2O_3$) on the surface of the GaN substrate is promoted. Then, while the light source 140 is emitting the excitation light, preferably ultraviolet light, and also while the voltage is being applied between the polishing tool 134 and the substrate 142, the rotating shaft 136 is rotated to rotate the polishing tool 134, and at the same time that the substrate holder 144 is rotated to rotate the substrate 142, the substrate 142 is lowered to cause the surface of the polishing tool 134 to contact the surface of the substrate 142 under a surface pressure preferably in the range from 0.1 to 1.0 kgf/cm$^2$. If the surface pressure is lower than 0.1 kgf/cm$^2$, then any warpage of the substrate 142 may not possibly be corrected and the substrate 142 may not possibly be polished uniformly in its entirety. If the surface pressure is higher than 1.0 kgf/cm$^2$, then the surface of the substrate 142 may possibly develop mechanical defects. In this manner, the surface of the substrate 142, such as a GaN substrate, is polished in the first stage for selectively removing regions of an Ga oxide formed on the surface of the substrate 142 which are held in contact with the polishing tool 134, i.e., for selectively removing the Ga oxide formed on the tip ends of convex regions the surface of the substrate 142 which has surface irregularities, primarily for removing damage to the surface of the substrate 142. The surface of the substrate 142 is polished in the first stage at a polishing rate up to about 1000 nm/h., for a machining time of about 5 minutes, for example.

Figure 17:
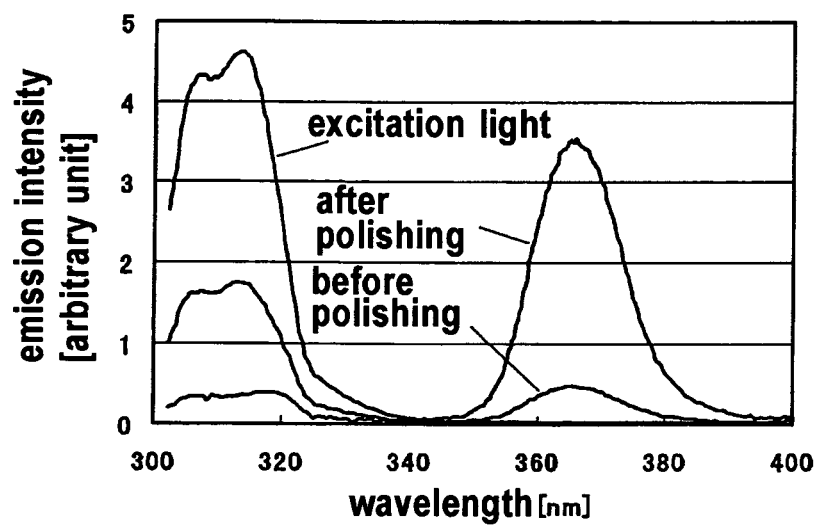
FIG. 17 is a graph showing excitation light and photoluminescence light before and after a polishing process in a photoluminescence-light-type damage level measuring device incorporated in the polishing apparatus shown in FIG. 10.

While the surface of the substrate 142 is being polished in the first stage, the spectrometer 208 of the photoluminescence-light-type damage level measuring device 202 performs a spectral analysis on photoluminescence light emitted from the surface of the substrate 142 and monitors the intensity of the photoluminescence light at a wavelength corresponding to the band gap of the substrate 142, e.g., at the wavelength of 365 nm for GaN. As shown in FIG. 17, as the polishing process progresses, the intensity of the photoluminescence light at the wavelength of 365 nm increases. An endpoint of the polishing process in the first stage is detected by detecting when the intensity of the photoluminescence light at the wavelength of 365 nm reaches a predetermined value or becomes constant.

Figure 18:
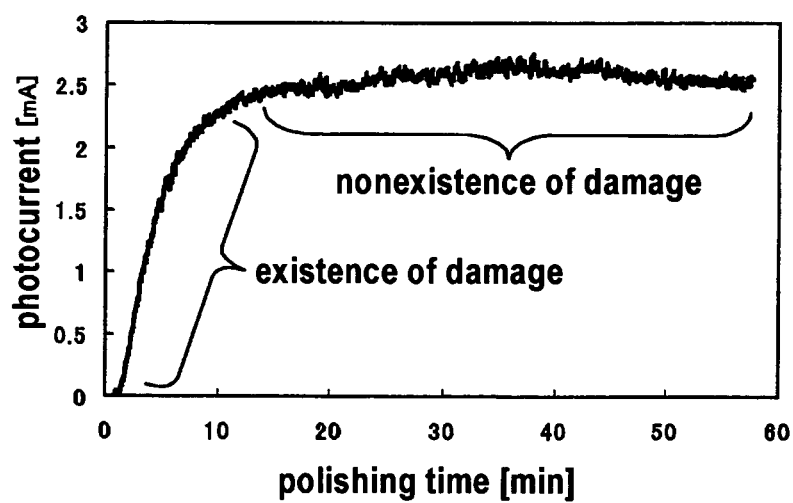
FIG. 18 is a graph showing the relationship between polishing times and photocurrent values when a photocurrent is measured during a polishing process by a photocurrent-type damage level measuring device incorporated in the polishing apparatus shown in FIG. 10.

When the polishing process in the first stage is ended, the switch 150 is turned off to stop applying the voltage between the polishing tool 134 and the substrate 142 while the excitation light, preferably ultraviolet light, is being continuously applied from the light source 140, thereby polishing the surface of the substrate 142 in the second stage for improving the surface roughness of the substrate 142. The surface of the substrate 142 is polished in the second stage at a polishing rate up to about 200 nm/h., for a machining time of about 30 minutes, for example. While the surface of the substrate 142 is being polished in the second stage, the switch 206 is turned on to enable the ammeter 204 of the photocurrent-type damage level measuring device 201 to measure a current flowing along the conductive wire 152c which connects the substrate 142 and the metal films (metal wires) 154 of the polishing tool 134. As shown in FIG. 18, as the polishing process progresses, the value of the current flowing through the ammeter 204 gradually increases until it becomes substantially constant in time. An endpoint of the polishing process in the second stage is detected by measuring the value of the current flowing through the ammeter 204 and detecting when the value of the current reaches a predetermined value or becomes constant.

After the polishing process in the second stage is ended, the excitation light, preferably the ultraviolet radiation, applied from the light source 140 is stopped, and the substrate holder 144 is raised, after which the rotation of the substrate 142 is stopped. If necessary, the surface of the substrate 142 is rinsed with pure water, and then the substrate 142 is transferred to the pusher 33 at the second transferring position TP2. The first linear transporter 5 transfers the substrate 142 on the pusher 33 to the lifter 35. The polishing apparatus 30B similarly receives the substrate 142 from the pusher 34 with the substrate holder 144, and polishes the substrate 142 in the first stage and the second stage. Thereafter, the polished substrate 142 is transferred to the lifter 35 at the fourth transferring position TP4.

The second transfer robot 40 receives the substrate 142 from the lifter 35 and places the substrate 142 onto the lifter 36 at the fifth transferring position TP5. The second linear transporter 6 moves to transfer the substrate 142 on the lifter 36 to the sixth transferring position TP6 or the seventh transferring position TP7.

The polishing apparatus 30C receives the substrate 142 from the pusher 37 with the substrate holder 244, and polishes the substrate 142 in the third stage. Specifically, the substrate holder 244, which is holding the substrate 142, such as a GaN substrate or the like, with its surface (surface to be processed) facing downwardly, is moved to a position above the container 234, and then is rotated and lowered to immerse the substrate 142 in the water 232 held in the container 234. The substrate holder 244 is further lowered to bring the surface of the substrate 142 into contact with the electrically conductive member 264, such as of platinum, of the polishing pad 242, which is being rotated, under a contact pressure (pressure force) in the range from 100 to 1000 hPa (from 0.1 to 1.0 kgf/cm$^2$), for example, preferably under a contact pressure of 400 hPa (0.4 kgf/cm$^2$). In this manner, the polishing process in the third stage is performed for finishing the surface of the substrate 142 by relatively moving the surface of the substrate 142 and the electrically conductive member 264 such as of platinum of the polishing pad 242 while holding them in contact with each other. The polishing process in the third stage may be performed while the water 232 is being supplied between the surface of the substrate 142 and the electrically conductive member 264, such as of platinum, of the polishing pad 242.

After the polishing process in the third stage is ended, the water 232 left on the surface of the substrate 142 is replaced with pure water by the pure water replacement section 192, and then the substrate 142 is returned to the sixth transferring position TP6. The polishing apparatus 30D similarly receives the substrate 142 from the pusher 38 with the substrate holder 244 and polishes (finishes) the surface of the substrate 142 in the third stage. The water 232 left on the surface of the substrate 142 after the polishing process is replaced with pure water by the pure water replacement section 194, and then the substrate 142 is returned to the seventh transferring position TP7. Thereafter, the second linear transporter 6 moves to move the substrate 142, on which the water 232 has been replaced with the pure water, to the fifth transferring position TP5.

The second transfer robot 40 takes the substrate out of the fifth transferring position TP5 and transfers the substrate to the reversing machine 41. The reversing machine 41 reverses the substrate through 180 and then transfers it to the first cleaning unit 42, where the substrate is cleaned. The third transfer robot 46 transfers the substrate from the first cleaning unit 42 to the second cleaning unit 43, where the substrate is cleaned.

The third transfer robot 46 transfers the substrate after cleaning to the third cleaning unit 44, where the substrate is cleaned with pure water. The third transfer robot 46 transfers the substrate after pure water cleaning to the drying unit 45, where the substrate is rinsed with pure water and then rotated at a high speed to spin-dry the substrate. The first transfer robot 22 receives the substrate after spin-drying from the drying unit 45 and returns the substrate to the substrate cassette mounted in the front loading section 200.

Figure 19A:
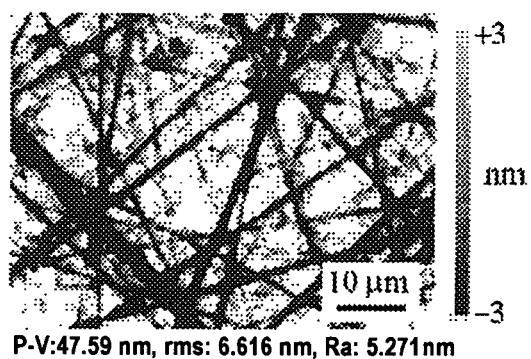
FIG. 19A is a diagram showing an interference microscope image of a GaN substrate surface before it is polished.
Figure 19B:
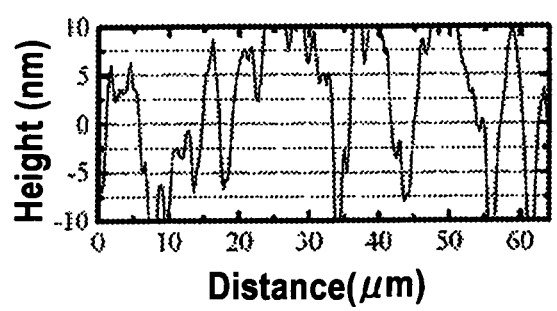
FIG. 19B is a diagram showing the relationship between distances and heights on the substrate surface.
Figure 20A:
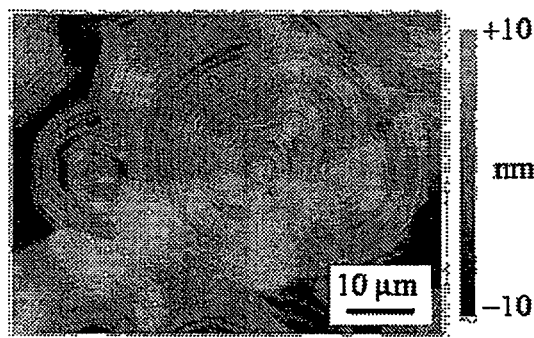
FIG. 20A is a diagram showing an interference microscope image of the GaN substrate surface after it is polished in a first stage.
Figure 20B:
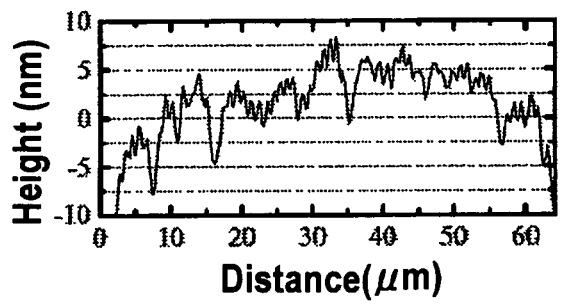
FIG. 20B is a diagram showing the relationship between distances and heights on the substrate surface.
Figure 21A:
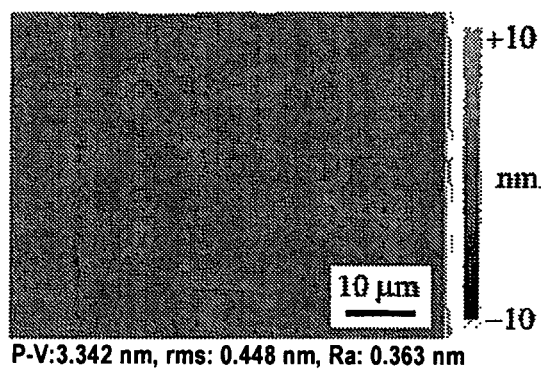
FIG. 21A is a diagram showing an interference microscope image of the GaN substrate surface after it is polished in a second stage.
Figure 21B:
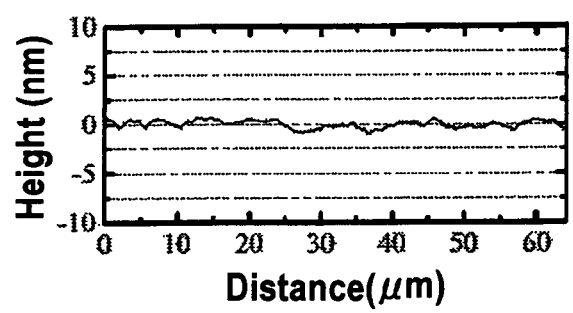
FIG. 21B is a diagram showing the relationship between distances and heights on the substrate surface.
Figure 22A:
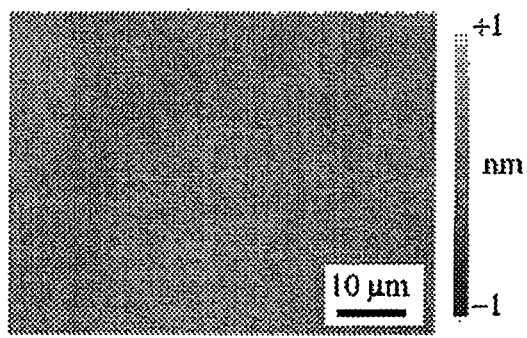
FIG. 22A is a diagram showing an interference microscope image of the GaN substrate surface after it is polished in a third stage.
Figure 22B:
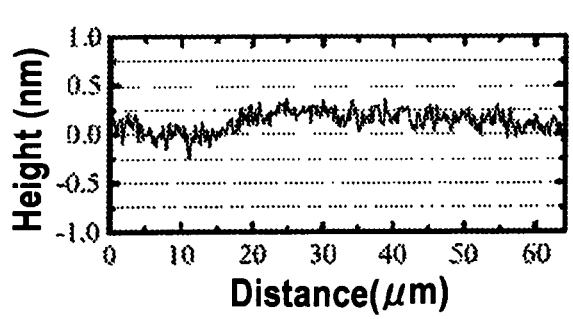
FIG. 22B is a diagram showing the relationship between distances and heights on the substrate surface.

An interference microscope image of a GaN substrate surface before it is polished is shown in FIG. 19A, and the relationship between distances and heights on the substrate surface is shown in FIG. 19B. An interference microscope image of the GaN substrate surface after it is polished in the first stage wherein the GaN substrate surface is polished at a polishing rate up to 1000 nm/h for 5 minutes with the excitation light and the voltage being applied is shown in FIG. 20A, and the relationship between distances and heights on the substrate surface is shown in FIG. 20B. An interference microscope image of the GaN substrate surface after it is polished in the second stage wherein the GaN substrate surface is polished at a polishing rate up to 200 nm/h for 30 minutes with only the excitation light being applied, after the polishing process in the first stage, is shown in FIG. 21A, and the relationship between distances and heights on the substrate surface is shown in FIG. 21B. An interference microscope image of the GaN substrate surface after it is polished in the third stage wherein the GaN substrate surface is polished at a polishing rate up to 10 nm/h for 180 minutes using platinum as the electrically conductive member and water with its pH adjusted to 5.5 by dissolving $CO_2$ in pure water, after the polishing process in the first stage and the polishing process in the second stage, is shown in FIG. 22A, and the relationship between distances and heights on the substrate surface is shown in FIG. 22B.

It can be seen from FIGS. 19 through 22B that the surface roughness Ra of the GaN substrate improved from Ra: 5.271 μm to Ra: 4.17 μm when it was polished in the first stage for 5 minutes, then improved to Ra: 0.363 μm when it was polished in the second stage for 30 minutes, and further improved to Ra: 0.083 μm when it was polished in the third stage for 180 minutes. It can thus be seen that a substrate having a sufficient level surface flatness can be obtained by polishing it for about 215 minutes.

Example 1

A GaN substrate was prepared by polishing a substrate surface in the first stage by applying excitation light and a voltage and then polishing the substrate surface in the second stage by applying only excitation light. The surface of the GaN substrate was polished (finished) in the third stage by the polishing apparatus shown in FIG. 14. In the polishing apparatus shown in FIG. 14, the electrically conductive member 264 was made of platinum, and water 232 with its pH adjusted to 5.5 by dissolving $CO_2$ in pure water with the gas dissolver 238 was poured into the container 234 provided by the dam member 236. The surface of the GaN substrate was polished for 3 hours by rotating the turntable 230 at a rotational speed of 10 rpm and holding the substrate surface and the electrically conductive member (platinum) 264 in contact with each other under a contact pressure (pressing force) of 0.4 kgf/cm$^2$.

Figure 23A:
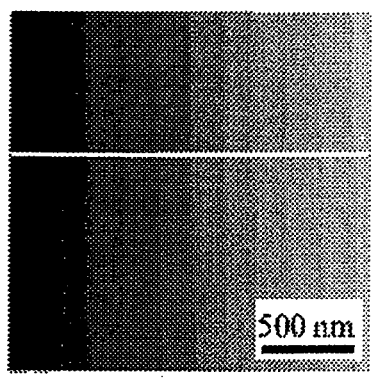
FIG. 23A is a diagram showing an atomic force microscope image of a GaN substrate surface after it is polished according to Example 1.
Figure 23B:
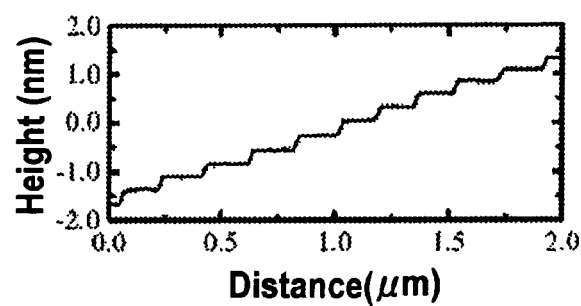
FIG. 23B is a diagram showing the relationship between distances and heights on the substrate surface.

An atomic force microscope (AFM) image of the GaN substrate surface after it is polished is shown in FIG. 23A, the relationship between distances and heights on the substrate surface is shown in FIG. 23B. Any etch pits depending on crystal defects are not observed from FIG. 23A, and a clear terrace-step structure is observed from FIG. 23B, indicating that the GaN substrate surface was polished in an atomic level to a flat damageless finish.

Comparative Example 1

A GaN substrate surface was polished under the same conditions as Example 1 except that an HF-dissolved solution was used instead of the water 232 with its pH adjusted to 5.5 by dissolving $CO_2$ in pure water with the gas dissolver 238.

Figure 24A:
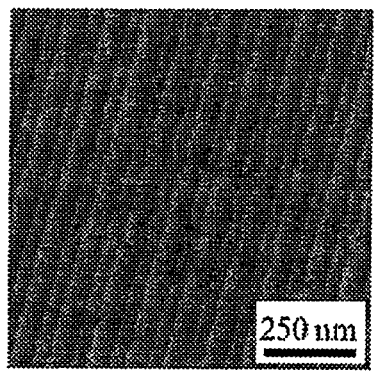
FIG. 24A is a diagram showing an atomic force microscope image of a GaN substrate surface after it is polished according to Comparative Example.
Figure 24B:
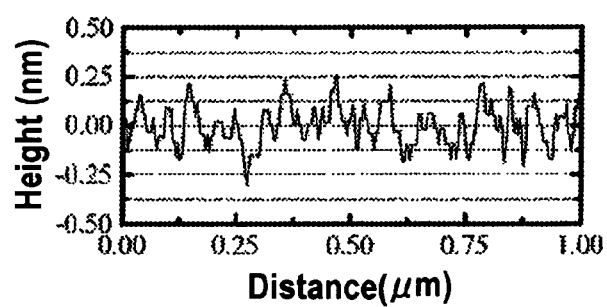
FIG. 24B is a diagram showing the relationship between distances and heights on the substrate surface.

An atomic force microscope (AFM) image of the GaN substrate surface after it is polished is shown in FIG. 24A, the relationship between distances and heights on the substrate surface is shown in FIG. 24B. Although a clear terrace-step structure is observed from FIG. 24B, strips of etch pits having a depth of 0.5 nm are observed on the terrace from FIG. 24A. The etch pits are considered to result from selective etching of crystal defects, etc. with highly corrosive HF.

Example 2

A GaN substrate surface was polished under the same conditions as Example 1 except that a bonded substrate (epitaxial substrate) with GaN mounted on a surface of a sapphire substrate was used instead of the GaN substrate made of only GaN.

Figure 25A:
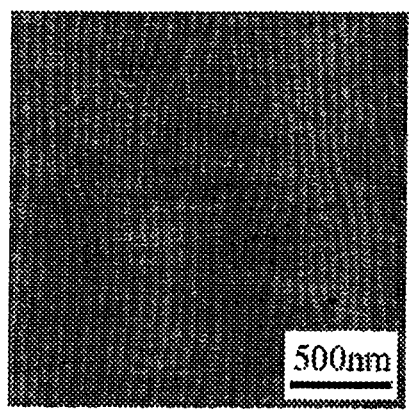
FIG. 25A is a diagram showing an atomic force microscope image of a GaN substrate surface after it is polished according to Example 2.
Figure 25B:
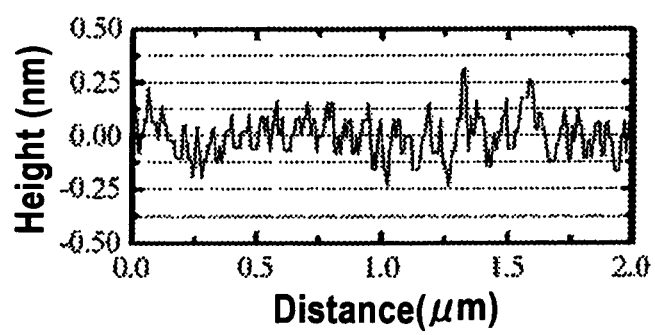
FIG. 25B is a diagram showing the relationship between distances and heights on the substrate surface.

An atomic force microscope (AFM) image of the substrate surface after it is polished is shown in FIG. 25A, the relationship between distances and heights on the substrate surface is shown in FIG. 25B. Any etch pits depending on crystal defects are not observed from FIG. 25A, and a clear terrace-step structure is observed from FIG. 25B, indicating that the substrate surface was polished in an atomic level to a flat damageless finish.

In this Example 2, the bonded substrate with GaN mounted on the surface of the sapphire substrate. It is also possible to polish a bonded substrate with GaN mounted on a surface of a SiC substrate, a bonded substrate with GaN mounted on a surface of a Si substrate, or a bonded substrate with GaN mounted on a surface of a GaAs substrate.

In the above embodiment, the polishing process in the first stage and the polishing process in the second stage are performed by the same polishing apparatus. However, the polishing process in the first stage and the polishing process in the second stage may be performed by separate polishing apparatus. Though the third polishing process is performed on a substrate which has been polished in the first stage and the second stage in the above embodiment, the third polishing process ma be performed on a substrate which has been polished in the first stage or the second stage.

Furthermore, a substrate after it has been processed by CMP, ion implantation, activation annealing, or RIE may be finished (polished in the third stage) by the polishing apparatus shown in FIG. 14.

Figure 26:
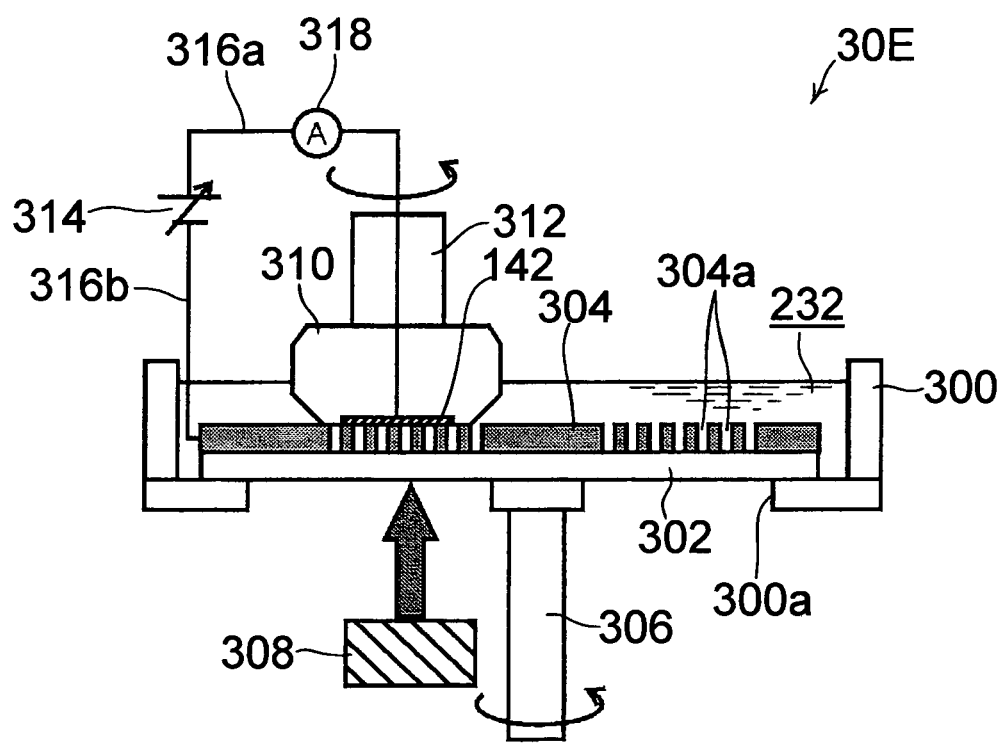
FIG. 26 is a schematic cross-sectional view of a polishing apparatus according to another embodiment of the present invention.

FIG. 26 is a schematic cross-sectional view of a polishing apparatus 30E according to another embodiment of the present invention. The polishing apparatus 30E is replaced with at least one of the polishing apparatuses 30C, 30D shown in FIG. 9, for example, and used for polishing process in the third stage.

As shown in FIG. 26, the polishing apparatus 30E includes a container 132 for holding therein water 232. Weak acid water, water with air dissolved therein, or electrolytic ion water is used as the water 232. A turntable 302 having light permeability is mounted on the bottom of the container 300, and a polishing pad 304 is mounted on an upper surface of the turntable 302, so that the polishing pad 304 becomes immersed in the water 232 when the container 300 is filled with the water 232. An electrically conductive member, for example, composed of platinum, is formed on at least a surface (upper surface) of the polishing pad 304 by vacuum evaporation or the like.

The container 300 is coupled to an upper end of a rotatable rotating shaft 306. The bottom plate of the container 300 has a ring-shaped opening 300a formed around the rotating shaft 306 and closed by the turntable 302. A light source 308 for emitting excitation light, preferably ultraviolet light, is disposed right below the opening 300a. The polishing pad 304 has a number of through holes 304 defined therein in a region corresponding the light source 308. Thus, the excitation light, preferably ultraviolet light, emitted from the light source 308, passes through the opening 300a of the container 300 and the through holes 304a of the polishing pad 304, and reaches above the polishing pad 304.

Right above the container 300 is disposed a substrate holder 310 for detachably holding a substrate 142, e.g., a GaN substrate, with a front surface facing downwardly. The substrate holder 310 is coupled to a lower end of a main shaft 312 that is rotatable and vertically movable. The substrate holder 310 and the main shaft 312 are identical in structure to the substrate holder 144 and the main shaft 146 shown in FIG. 10, and will not be described in detail below.

The polishing apparatus 30E of this embodiment is also provided with a power source 314 for applying voltage between the substrate 142 held by the substrate holder 310 and the polishing pad 304. An ammeter 318 is interposed in a conductive wire 316a extending from the positive pole of the power source 314. The conductive wire 316a extending from the positive pole of the power source 314 is connected to the substrate 142 held by the substrate holder 310, and a conductive wire 316b extending from the negative pole of the power source 314 is connected to the polishing pad 304.

Figure 27:
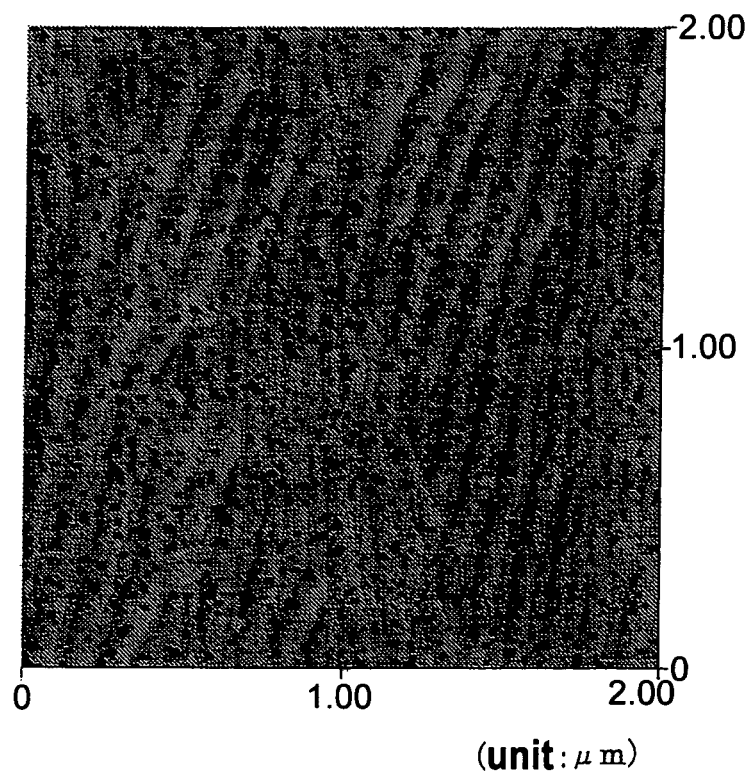
FIG. 27 is a diagram showing an atomic force microscope image of a GaN substrate surface after it is polished by the polishing apparatus shown in FIG. 26 while applying excitation light to the GaN substrate surface.

When a substrate having deep scratches locally is polished, a large amount of shavings should be removed for removing the scratches. Since the polishing rate is lowered when most of a substrate is flattened as the polishing process progresses, it takes a long time to polish a substrate until the deep scratches locally present in the substrate are removed. In this case, the surface of the substrate 142 is polished by the polishing apparatus 30E shown in FIG. 26 while applying excitation light to the surface of the substrate 142 and voltage, as necessary, between the substrate 142 and the polishing pad 304. By thus polishing the substrate 142, the surface of the substrate 142 is polished while minute etch pits (1-2 nm) are being formed on the surface of the substrate 142 because of the influence of the excitation light, as shown in FIG. 27. The surface of the substrate 142 is polished at the polishing rate equal to the polishing rate when the surface having surface roughness is polished because of the present of the etch pits, and therefore a large amount of shavings can be removed without lowering the polishing rate. By performing finish polishing process after the application of the excitation light and the voltage are stopped, the etch pits formed on the surface of the substrate can be removed.

If the substrate comprises a GaN substrate, then since the band gap of GaN is of 3.42 eV, the excitation light should preferably have a wavelength equal to or lower than the wavelength corresponding to the band gap of the workpiece, i.e., equal to or lower than 365 nm, e.g., should preferably have a wavelength of 312 nm.

For example, as described above, the polishing apparatus 30A or 30B performs the polishing process in the first stage for five minutes while applying the excitation light, preferably ultraviolet light, from the light source 140 and the voltage between the polishing tool 134 and the substrate 142. The polishing apparatus 30A or 30B performs the polishing process in the second stage for 25 minutes successively while applying the voltage between the polishing tool 134 and the substrate 142 is stopped and the excitation light, preferably ultraviolet light, is being continuously applied from the light source 140.

Next, the polishing apparatus 30E shown in FIG. 26 performs a first step polishing process in the third stage for 15 minutes while applying the excitation light, preferably ultraviolet light, from the light source 308 and the voltage between the polishing pad 304 and the substrate 142. Then, the polishing apparatus 30E performs a second step polishing process in the third stage for 25 minutes while applying the excitation light from the light source 408 and the voltage between the polishing pad 304 and the substrate 142 are stopped.

By thus dividing the polishing process in the third stage into two polishing step and performing the polishing process, a substrate, e.g., having deep scratches locally can be polished effectively.

In the above embodiment, the surface of the subs e 142 is polished while applying the excitation light to the surface of the substrate 142, and then finishing the surface of the substrate 142 without applying the excitation light to the surface of the substrate 142. A polishing process for polishing the surface of the substrate 142 while applying excitation light to the surface of the substrate 142, and a polishing process for polishing the surface of the substrate 142 without applying excitation light to the surface of the substrate 142 may be repeated alternately. In this case, the surface of the substrate 142 is finally polished for finishing without applying excitation light to the surface of the substrate 142, In the above embodiment, the substrate 142 is polished while applying the excitation light to the surface of the substrate 142 and the voltage, if necessary, between the substrate 142 and the polishing pad 304. The substrate 142 may be polished while applying the voltage between the substrate 142 and the polishing pad 304 without applying the excitation light to the surface of the substrate 142. This can form etch pits on the surface of the substrate 142 and enhance the polishing rate.

Figure 28:
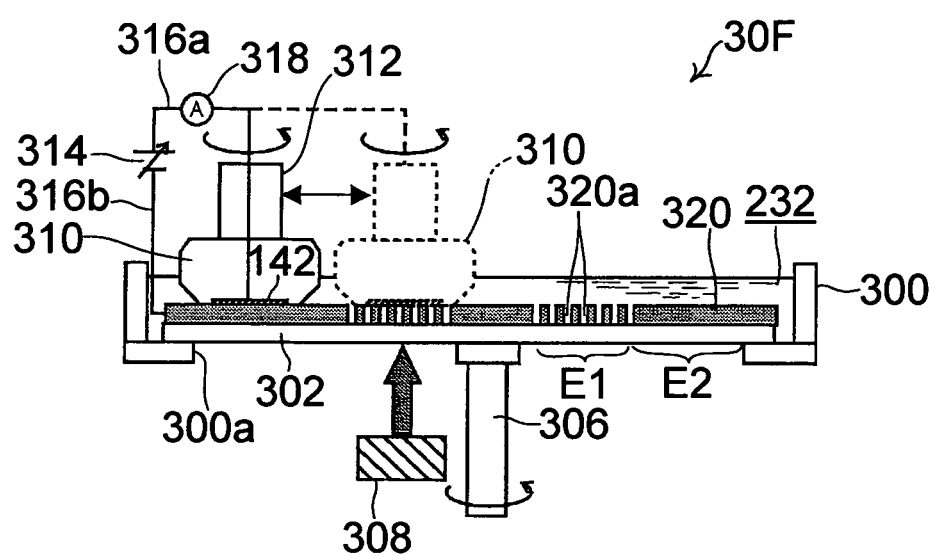
FIG. 28 is a schematic cross-sectional view of a polishing apparatus according to yet another embodiment of the present invention.

FIG. 28 is a schematic cross-sectional view of a polishing apparatus 30F according to yet another embodiment of the present invention. The polishing apparatus 30F shown in FIG. 28 is different from the polishing apparatus 30E shown in FIG. 26 is that: a polishing pad 320 comprising a light transmission area E1 having through holes 320a and a light non-transmission area E2 is used instead of the polishing pad 304; and the substrate holder 320 is configured to reciprocate between the light transmission area E1 and the light non-transmission area E2 on the polishing pad 320.

According to this embodiment, the application of the excitation light to the substrate 142 held by the substrate holder 310 can be stopped by moving the substrate holder 310 from the light transmission area E1 to the light non-transmission area E2 on the polishing pad 320 while applying the excitation from the light source 308.

Figure 29:
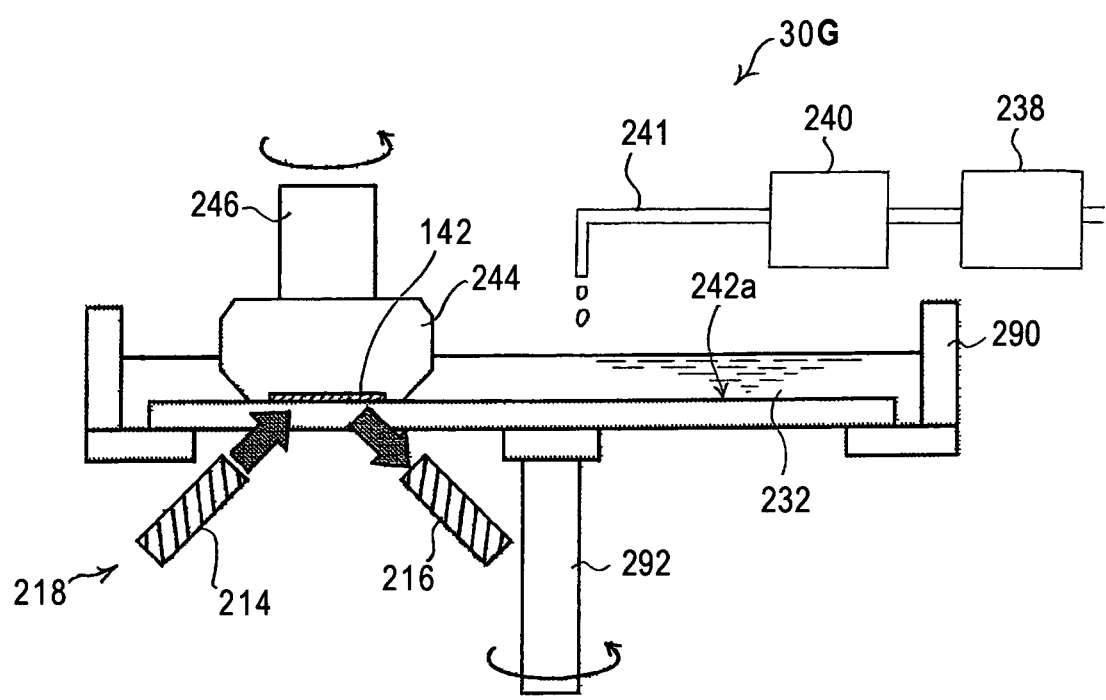
FIG. 29 is a schematic cross-sectional view of a polishing apparatus according to yet another embodiment of the present invention.

FIG. 29 is a schematic cross-sectional view of a polishing apparatus 30G according to yet another embodiment of the present invention. The polishing apparatus 30G is replaced with at least one of the polishing apparatuses 30C, 30D shown in FIG. 9, for example, and used for polishing in the third stage.

As shown in FIG. 29, the polishing apparatus 30G has a container 290 for holding therein water 232 such as weak acid water, water with air dissolved therein, or electrolytic ion water. A polishing pad 242a made of a light-permeable material is attached to the bottom of the container 290. The polishing pad 242a is connected to an upper end of a rotatable rotating shaft 292. The polishing apparatus 30G also includes a Raman-light-type damage level measuring device 218 which comprises a laser beam source 214 for applying a visible monochromatic beam to a surface of a substrate 142 which is held by the substrate holder 244 and a spectrometer 216 for performing a spectral analysis on reflected light from the surface of the substrate 142 and measuring the intensity of Raman light. The other structural details are identical to those of the polishing apparatus shown in FIG. 14.

Figure 30:
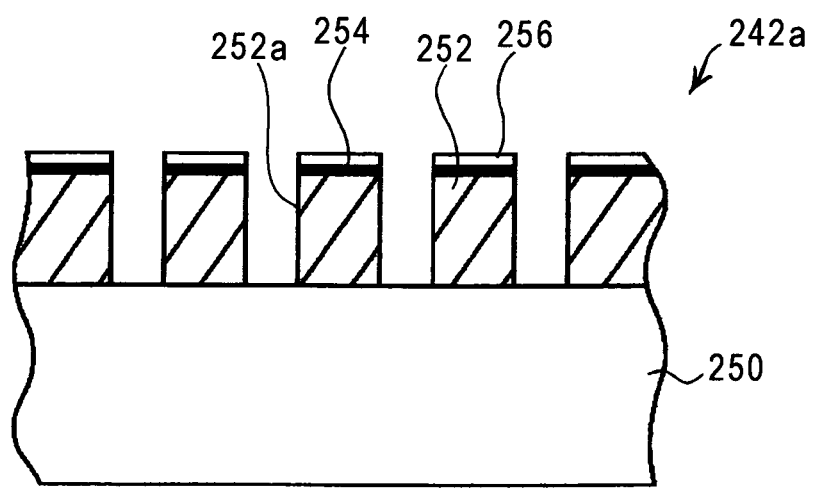
FIG. 30 is an enlarged cross-sectional view of a polishing tool of the polishing apparatus shown in FIG. 29.

As shown in FIG. 30, the polishing pad 242a comprises a base 250 made of transparent glass or the like, for example, an elastic body 252 having a Shure hardness in the range from 50 to 90 disposed on a surface of the base 250, the elastic body 252 having light-permeable through holes 252a defined therein at grid pattern positions for contact with the substrate, an intermediate layer 254 deposited on a surface of the elastic body 252 by vacuum evaporation or the like, and an electrically conductive member 256 deposited on a surface of the intermediate layer 254 by vacuum evaporation or the like. The electrically conductive member 256 that is disposed on the surface of the elastic body 252 with the intermediate layer 254 interposed therebetween finds it easy to follow irregularities in long/single periods on the surface (surface to be polished) of the substrate 142.

The elastic body 252 may be made of rubber, resin, foamable resin, non-woven fabric or the like, for example, and has a thickness in the range from 0.5 to 5 mm. The elastic body 252 may comprise two or more superposed layers of elastic material which have different modulus of elasticity.

The intermediate layer 254 has a thickness in the range from 1 to 10 nm, for example. The intermediate layer 254 is interposed between the elastic body 252 and the electrically conductive member 256 in order to increase the adhesion between the elastic body 252 and the electrically conductive member 256, and is made of chromium or graphite (SP2-bonded) carbon, for example, which have good adhesion to both the elastic body 252 and the electrically conductive member 256. When the intermediate layer 254 is formed on the surface of the elastic body 252 by vacuum evaporation, it is preferable to employ ion sputtering deposition in order to suppress expansion and modification of the elastic body 252 due to high temperatures. This holds true also when the electrically conductive member 256 is formed on the surface of the intermediate layer 254 by vacuum evaporation.

The electrically conductive member 256 has a thickness in the range from 100 to 1000 nm, for example. If the thickness is smaller than 100 nm, then the electrically conductive member 256 will be unduly worn when the polishing process is carried out for about one hour, and hence is not practical. If the thickness is greater than 1000 nm, then the surface of the electrically conductive member 256 will tend to crack when the polishing process is carried out. The electrically conductive member 256 is preferably made of platinum, but may be made of any of precious metals such as gold, transition metals (Ag, Fe, Ni, Co, etc.), graphite, electrically conductive resin, electrically conductive rubber, electrically conductive organic matter etc. which are insoluble or slightly soluble (at a solving rate of 10 nm/h. or lower) in the water 232.

When the polishing apparatus 30G shown in FIG. 29 performs the polishing process in the third stage, the laser beam source 214 of the Raman-light-type damage level measuring device 218 applies a visible monochromatic beam to the surface of the substrate 142 held by the substrate holder 244 through the base 250 and the light-permeable through holes 252a in the elastic body 252 of the polishing pad 242a, and the spectrometer 216 performs a spectral analysis on the reflected light from the surface of the substrate 142 and measures the intensity of Raman light. As described above, as the polishing process progresses, the intensity of the Raman light increases, as shown in FIG. 8. Therefore, an endpoint of the polishing process in the third stage is detected by detecting when the intensity of the Raman light reaches a predetermined value or becomes constant.

In the above embodiment, the endpoint of the polishing process in the first stage is detected by the photoluminescence-light-type damage level measuring device 202. However, the endpoint of the polishing process in the first stage may be detected by the Raman-light-type damage level measuring device 218 shown in FIG. 29. Alternatively, the endpoint of the polishing process in the first stage may be detected by a combination of the photoluminescence-light-type damage level measuring device 202 and the Raman-light-type damage level measuring apparatus 218 based on an average value of their output signals.

Though the endpoint of the polishing process in the second stage is detected by the photocurrent-type damage level measuring device 201, it may be detected by the photoluminescence-light-type damage level measuring device 202 or the Raman-light-type damage level measuring apparatus 218 shown in FIG. 29, or two or more damage level measuring apparatus based on an average value of their output signals. The polishing process in the first stage and the polishing process in the second stage are performed using a pH buffer solution of a neutral pH which contains Ga ions. However, the detection of the endpoints is not limited to these polishing processes.

Since SiC and GaN are permeable to visible light and infrared rays, visible light or infrared rays may be applied to a substrate, and the thickness of the substrate may be measured based on light reflected from the face and reverse sides of the substrate. A film thickness measuring device based on such a light interference process and the above processes of monitoring the progress of the polishing process may be combined and used complementarily.

Figure 31:
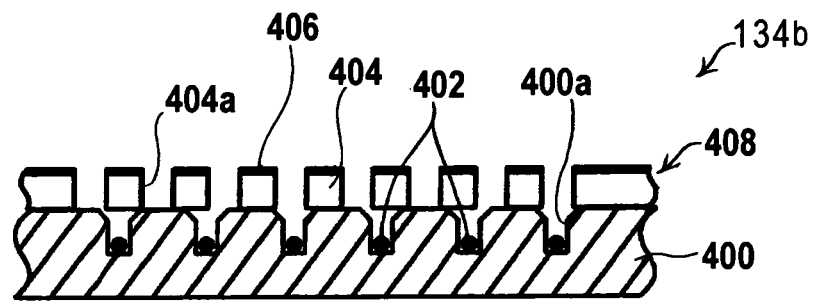
FIG. 31 is an enlarged cross-sectional view of still another polishing tool for use in the polishing apparatus shown in FIG. 10.
Figure 32:
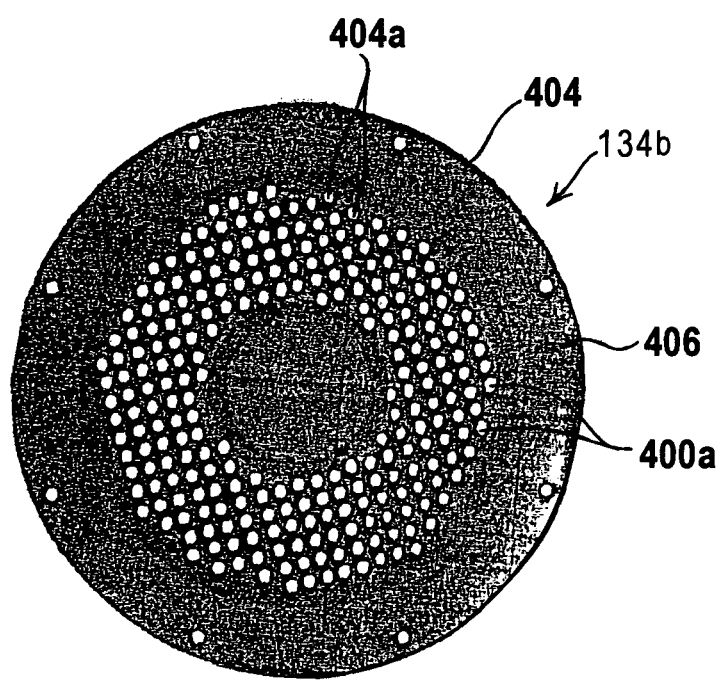
FIG. 32 is a plan view of the polishing tool shown in FIG. 31.

FIG. 31 is a cross-sectional of still another polishing tool 134b for use in the polishing apparatuses 30A, 30B shown in FIG. 10, and FIG. 32 is a plan view of the polishing tool 134b shown in FIG. 31. As shown in FIGS. 31 and 32, the polishing tool 134b comprises a support platen 400 having a number of concentric grooves 400a defined therein in a region corresponding to the opening 132a of the container 132 and metal lines 402 disposed as metal wires in the grooves 400a, and a catalyst pad 408 including a pad base 404 disposed on the support platen 400 and having a plurality of through holes 404a defined therein in a scattered pattern for passing therethrough at least one of light and an ion current and a catalyst layer 406 deposited on the pad base 404 by vacuum evaporation or the like in areas except the through holes 404a.

Figure 33:
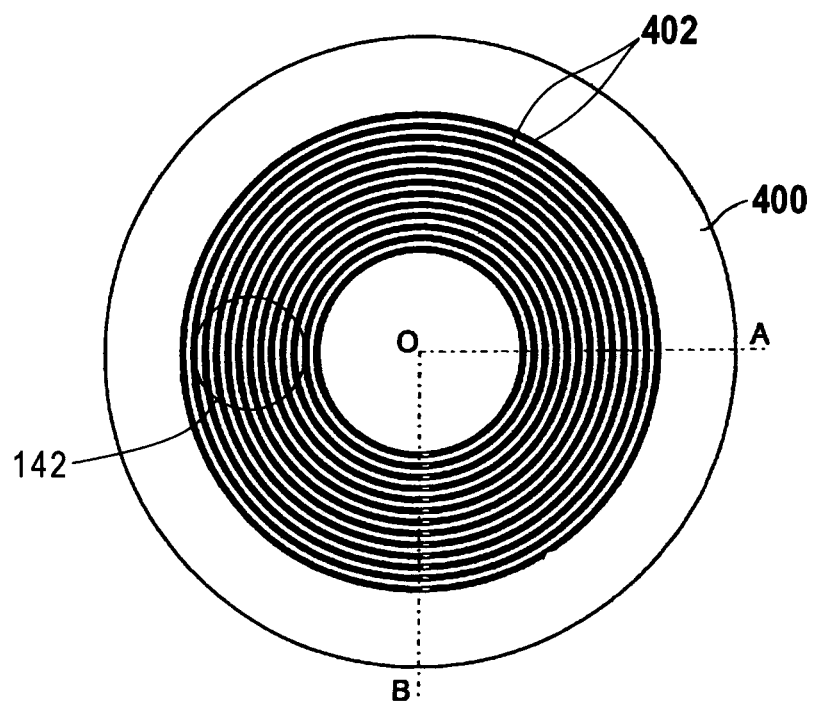
FIG. 33 is a plan view of a support platen of the polishing tool shown in FIG. 31.
Figure 34:
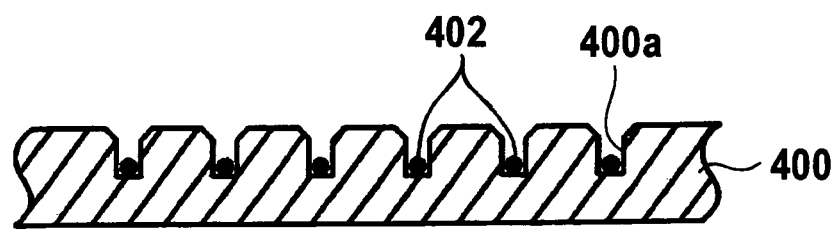
FIG. 34 is a cross-sectional view taken along line O-A of FIG. 33.

As shown in FIG. 33, the metal lines 402 extend fully diametrically across the substrate 142 which is held by the substrate holder 144. As shown in FIG. 32, the through holes 404a are positioned in a region where the metal lines 402 are disposed.

The catalyst pad 408 is of a diameter which is substantially the same (same shape) as the diameter of the support platen 400 or smaller (small shape) than the diameter of the support platen 400. The catalyst pad 408 is detachably mounted on the support platen 400 by screws or double-faced adhesive tapes at its outer circumferential edge. The polishing tool 134b itself is also detachably mounted on the bottom plate of the container 132 by mechanical fasteners such as screws or the like.

Since the support platen 400 and the catalyst pad 408 are separate from each other and the catalyst pad 408 has a high level of surface flatness and does not tend to produce burrs, scratches, etc., the polishing tool 134b is capable of producing a flat polished surface free of burrs, scratches, etc. Further, when the catalyst layer 406 is worn, the polishing tool 134b is replaced with a new one as follows: The polishing tool 134b is removed from the bottom plate of the container 132, and then the catalyst pad 408 is detached from the support platen 400. A new catalyst pad 408 is mounted on the support platen 400, and the polishing tool 134b with the new catalyst pad 408 is mounted on the bottom plate of the container 132. As the support platen 400 can be reused, the polishing tool 134b is inexpensive and highly durable.

The support platen 400 is made of a light-permeable material such as glass such as synthetic quartz or the like or light-permeable resin such as acrylic resin or the like. The metal lines 402 as metal wires are made of platinum, gold, silver, copper, aluminum, or the like. The pad base 404 is made of glass, rubber, light-permeable resin, foamable resin, or non-woven fabric.

The catalyst pad 408 is constructed of the catalyst layer 406 and the pad base 404. The catalyst layer 406 is made of one or more of a precious metal, a transition metal, a ceramics-based solid catalyst, a base solid catalyst, and an acid solid catalyst, for example. The precious metal comprises one of platinum, gold, and silver or a combination thereof. The transition metal comprises at least one of Fe, Ni, Co, Cu, Cr, i, molybdenum, and a compound thereof or a combination thereof. The base solid catalyst or the acid solid catalyst comprises one of non-woven fabric, resin, and metal, an acid or base metal oxide, and glass with an ion exchange function or a combination thereof.

In this embodiment, the catalyst layer 406 is formed on the surface of the pad base 404 by depositing one of the above-described materials or a combination thereof by the way of vacuum evaporation. The catalyst layer 406 can be formed uniformly to a desired thickness on the surface of the pad base 404 by vacuum evaporation.

The catalyst pad 408 may be made of only quartz glass. If the catalyst pad 408 is made of quartz glass, it can be separate from and detachably mounted on the support platen 400, so that the metal lines (metal wires) 402 in the support platen 400 can be reused.

The pad base 404 should preferably is made of an elastic material such as rubber or the like. In this case, since the pad base 404 is elastically deformable along the surface (surface to be processed) of the substrate 142, even if the catalyst pad 408 has surface irregularities, they are prevented from being transferred to the surface of the substrate 142. For example, if the pad base 404 is made of resin and the adhesion between the pad base 404 of resin and the catalyst layer 406 is weak, then carbon is evaporated on the surface of the pad base 404 of resin, and the catalyst layer 406 is formed on the carbon by evaporation, so that the adhesion between the pad base 404 of resin and the catalyst layer 406 is increased by the carbon. The catalyst pad 408 with increased adhesion as a whole can thus be produced.

Figure 35:
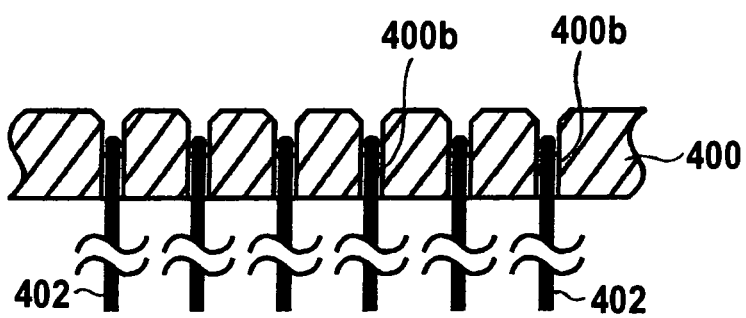
FIG. 35 is a cross-sectional view taken along line O-B of FIG. 33.

In this embodiment, as shown in FIG. 35, the support platen 400 has a plurality of through holes 406b defined therein, and the metal wires 402 extend through the through holes 400b to the surface of the support platen 400. The metal lines (metal wires) 402 are disposed along the grooves 400a defined concentrically in the surface of the support platen 400, and the conductive wire 152b extending from the cathode of the power source 148 is connected to the metal lines 402.

Figure 36:
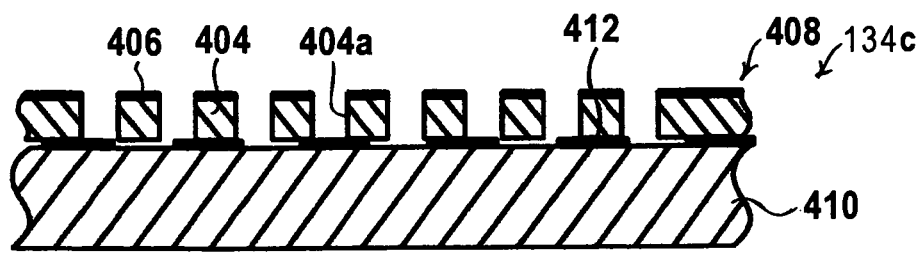
FIG. 36 is an enlarged cross-sectional view of yet another polishing tool for use in the polishing apparatus shown in FIG. 10.
Figure 37:
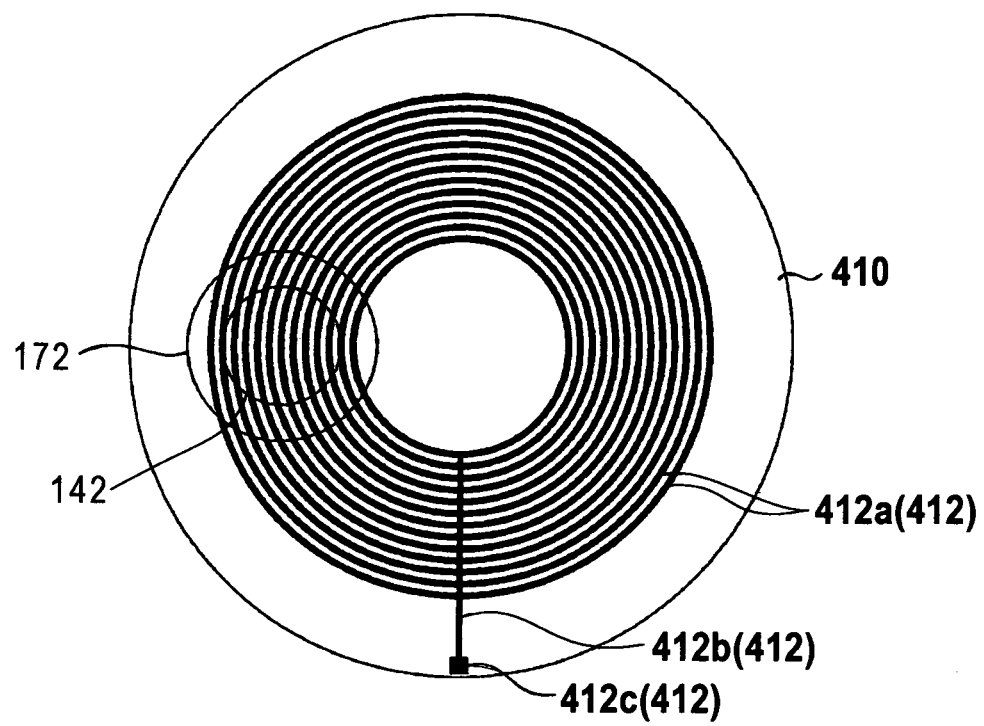
FIG. 37 is a plan view of a support platen of the polishing tool shown in FIG. 36.

FIGS. 36 and 37 show yet another polishing tool 134c for use in the polishing apparatuses 30A, 30B shown in FIG. 10. The polishing tool 134c is different from the polishing tool 134b shown in FIGS. 31 and 32 in that metal films 412 serving as metal wires are deposited on a flat surface of a support platen 410 by vacuum evaporation. The catalyst pad 408, which is identical to the catalyst pad 408 described above, is detachably mounted on the surface of the support platen 410 by screws, double-faced adhesive tapes, or the like. The metal films (metal wires) 412 comprise a plurality of concentric metal films 412a and at least one straight connecting metal film 412b which connects the concentric metal films 412a. The connecting metal film 412b has an electrode 412c at a proximal end thereof to which the conductive wire 152b extending from the cathode of the power source 148 is connected.

In this embodiment, as shown in FIG. 37, the concentric metal films 412a extend fully diametrically across the substrate 142 which is held by the substrate holder 144. The retainer ring 172 has opposite sides slightly projecting from the region where the concentric metal films 412a are disposed.

Figure 38:
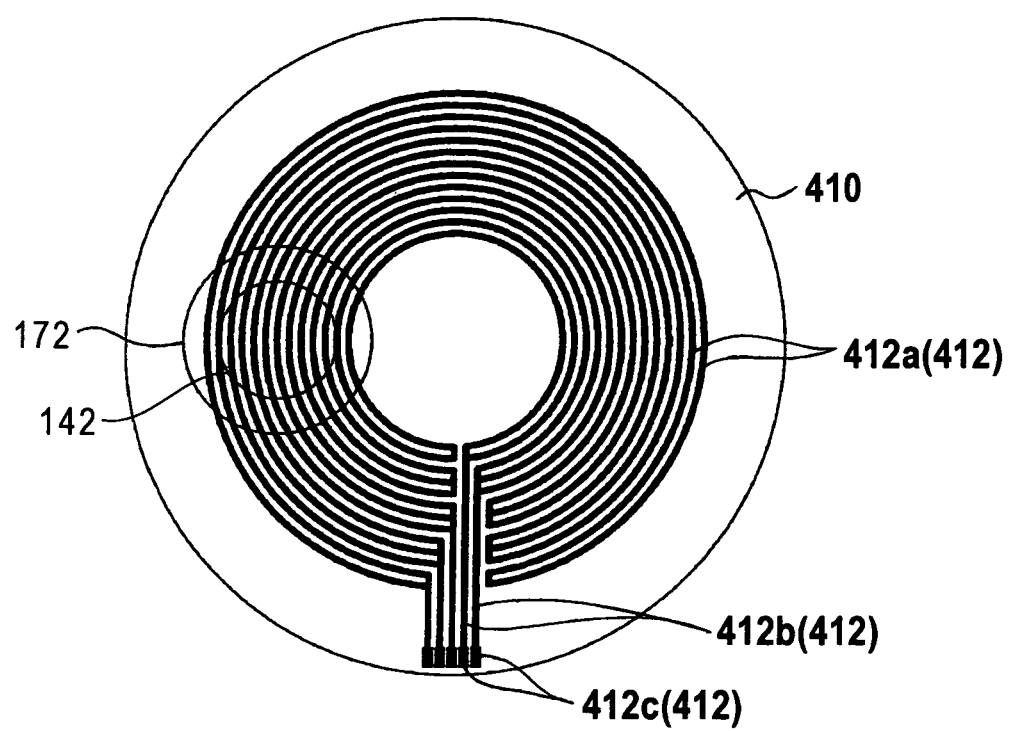
FIG. 38 is a plan view of another support platen.

As shown in FIG. 38, the support platen 410 may be divided into a plurality of zones (five zones in FIG. 38), and concentric metal films 412a disposed in the respective zones may be connected individually to a plurality of connecting metal films 412b. The connecting metal films 412b may have respective electrodes 412c connected individually to a plurality of conductive lines extending respectively from the cathodes of a plurality of power sources for controlling polishing rates in the respective zones.

Figure 39:
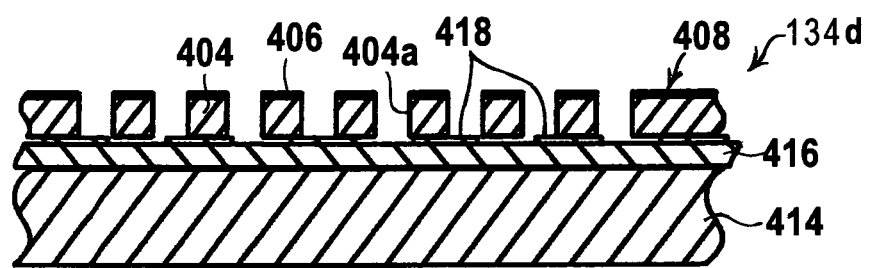
FIG. 39 is an enlarged cross-sectional view of a still further polishing tool for use in the polishing apparatus shown in FIG. 10.

FIG. 39 shows a still further polishing tool 134d for use in the polishing apparatuses 30A, 30B shown in FIG. 10. The polishing tool 134d is different from the polishing tool 134b shown in FIGS. 31 and 32 in that a light-permeable wiring film 416 made of fluororesin, acrylic resin, or the like and having a thickness in the range from 10 to 500 μm, for example, is interposed between a flat surface of a support platen 410 and the catalyst pad 408. A wiring pattern 418 serving as metal wires is evaporated on an upper surface of the wiring film 416. The wiring pattern (metal wires) 418 comprises a plurality of concentric metal films as shown in FIG. 37, for example. The concentric metal films may be divided into a plurality of zones as shown in FIG. 38.

Figure 40:
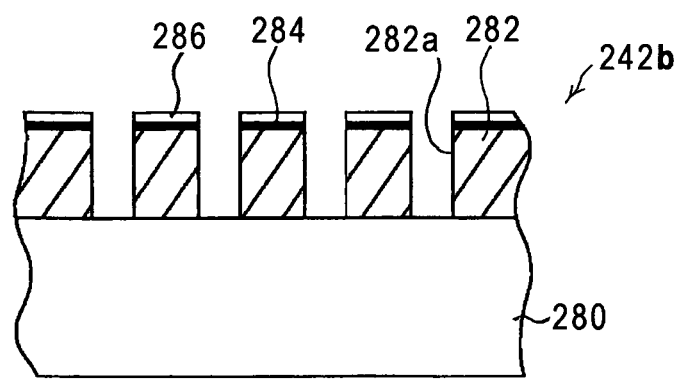
FIG. 40 is an enlarged cross-sectional view of another polishing pad for use in the polishing apparatus shown in FIG. 14.

FIG. 40 shows another polishing pad 242b for use in the polishing apparatuses 30C, 30D shown in FIG. 14. The polishing pad 242b is different from the polishing pad 242 shown in FIG. 15 in that it includes a support platen 280 made of a light-permeable material such as glass such as synthetic quartz or the like or light-permeable resin such as acrylic resin or the like, an elastic base 282 made of an elastic material and having a number of through holes 282a defined therein, the elastic base 282 being disposed on an upper surface of the support platen 280, an intermediate layer 284 deposited on a surface of the elastic base 282 in areas except the through holes 282a by vacuum evaporation or the like, and an electrically conductive member 286 deposited on an upper surface of the intermediate layer 284 by vacuum evaporation or the like.

INDUSTRIAL APPLICABILITY

The polishing method and the polishing apparatus according to the present invention are used to polish flatwise a surface (surface to be processed) of a substrate such as a single substrate made of a compound semiconductor (e.g., GaN) containing an element such as Ga, Al, In, or the like, or a bonded substrate (epitaxial substrate) on which a compound semiconductor containing an element such as Ga, Al, In, or the like is mounted.

The invention claimed is:
1. A polishing method of polishing a surface of a substrate made of a compound semiconductor containing either one of Ga, Al, and In, the polishing method comprising:
relatively moving the surface of the substrate and a surface of a polishing pad having an electrically conductive member in an area of the surface which is held in contact with the substrate, while holding the surface of the substrate and the surface of the polishing pad in contact with each other, in the presence of weak acid water, or water with air dissolved therein,
wherein the weak acid water or the water with air dissolved therein has a pH in the range from 3.5 to 6.0.
2. A polishing method according to claim 1, wherein the electrically conductive member is made of a precious metal, a transition metal, graphite, electrically conductive resin, electrically conductive rubber, or electrically conductive organic matter.
3. A polishing method according to claim 1, wherein the compound semiconductor containing either one of Ga, Al, and In comprises GaN, GaP, GaAs, AlN, AlP, AlAs, InN, InP, or InAs.
4. A polishing method according to claim 1, wherein the surface of the substrate is polished while applying excitation light to the surface of the substrate via through holes provided in the polishing pad.
5. A polishing method according to claim 1, wherein the surface of the substrate is polished while applying voltage between the polishing pad and the substrate.
6. A polishing method according to claim 1, wherein the surface of the substrate is polished while controlling at least one of the temperature of the water, the temperature of the substrate, and the temperature of the polishing pad.
7. A polishing method according to claim 1, wherein a first polishing process for polishing the surface of the substrate while applying excitation light to the surface of the substrate, and a second polishing process for polishing the surface of the substrate without applying excitation light to the surface of the substrate are performed successively.
8. A polishing method according to claim 1, wherein a first polishing process for polishing the surface of the substrate while applying excitation light to the surface of the substrate, and a second polishing process for polishing the surface of the substrate without applying excitation light to the surface of the substrate are repeated alternately.
9. A polishing method according to claim 1, wherein a third polishing process for polishing the surface of the substrate while applying voltage between the substrate and the polishing pad, and a fourth polishing process for polishing the surface of the substrate without applying voltage between the substrate and the polishing pad are performed successively.
10. A polishing method according to claim 1, wherein a third polishing process for polishing the surface of the substrate while applying voltage between the substrate and the polishing pad, and a fourth polishing process for polishing the surface of the substrate without applying voltage between the substrate and the polishing pad are repeated alternately.
11. A polishing method of polishing a surface of a substrate at least partly made of a compound semiconductor containing either one of Ga, Al, and In, the polishing method comprising:
relatively moving the surface of the substrate and a surface of a polishing pad having an electrically conductive member in an area of the surface which is held in contact with the substrate, while holding the surface of the substrate and the surface of the polishing pad in contact with each other, in the presence of water, or water with air dissolved therein,
wherein the water with air dissolved therein comprises water with $CO_2$ in air being dissolved therein while the surface of the substrate is being polished in an air atmosphere after the surface of the substrate has started being polished by the polishing pad which is supplied with pure water or tap water.

12. A polishing method according to claim 11, wherein the water is $N_2$-purged water.

13. A polishing apparatus for polishing a surface of a substrate made of a compound semiconductor containing either one of Ga, Al, and In, the polishing apparatus comprising:
- a container for holding therein weak acid water, or water with air dissolved therein;
- a polishing pad having an electrically conductive member in an area of a surface thereof which is held in contact with the substrate, the polishing pad being disposed in the container while being immersed in the water;
- a substrate holder for holding the substrate and bringing the substrate into contact with the polishing pad while immersing the substrate in the water in the container; and
- a moving mechanism for relatively moving the polishing pad and the substrate held by the substrate holder while holding the polishing pad and the substrate in contact with each other,
- wherein the weak acid water or the water with air dissolved therein has a pH in the range from 3.5 to 6.0.

14. A polishing apparatus according to claim 13, wherein the polishing pad has a number of through holes, and the polishing apparatus is configured to apply excitation light to the surface of the substrate held by the substrate holder via the through holes of the polishing pad.

15. A polishing apparatus according to claim 13, wherein the polishing pad has a light transmission area for applying excitation light to the surface of the substrate held by the substrate holder via a number of the through holes and a light non-transmission area, and the moving mechanism is configured to reciprocate the substrate holder between the light transmission area and the light non-transmission area on the polishing pad.

16. A polishing apparatus according to claim 13, further comprising a conductive wire connecting the polishing pad and the substrate held by the substrate and interposing therein a power source.

17. A polishing apparatus according to claim 13, wherein the electrically conductive member is made of a precious metal, a transition metal, graphite, electrically conductive resin, electrically conductive rubber, or electrically conductive organic matter.

18. A polishing apparatus according to claim 13, wherein the compound semiconductor containing either one of Ga, Al, and In comprises GaN, GaP, GaAs, AlN, AlP, AlAs, InN, InP, or InAs.

19. A polishing apparatus for polishing a surface of a substrate made of a compound semiconductor containing either one of Ga, Al, and In, the polishing apparatus comprising:
- a polishing pad having an electrically conductive member in an area of a surface thereof which is held in contact with the substrate;
- a substrate holder for holding the substrate and bringing the substrate into contact with the polishing pad;
- a moving mechanism for relatively moving the polishing pad and the substrate held by the substrate holder while holding the polishing pad and the substrate in contact with each other; and
- a water supply section for supplying weak acid water, or water with air dissolved therein, to a contacting region of the polishing pad and the substrate held by the substrate holder,
- wherein the water with air dissolved therein comprises water with $CO_2$ in air being dissolved therein while the surface of the substrate is being polished in an air atmosphere after the surface of the substrate has started being polished by the polishing pad which is supplied with pure water or tap water.

* * * * *

UNITED STATES PATENT AND TRADEMARK OFFICE
CERTIFICATE OF CORRECTION

PATENT NO. : 8,912,095 B2  
APPLICATION NO. : 13/511802  
DATED : December 16, 2014  
INVENTOR(S) : Yasuhisa Sano Page 1 of 1

It is certified that error appears in the above-identified patent and that said Letters Patent is hereby corrected as shown below:

On the Title Page item (30) Foreign Application Priority Data, after line 1, please insert the following:

--Dec. 15, 2009 (JP) ........................................ 2009-284493  
   Dec. 15, 2009 (JP) ........................................ 2009-284491--

Signed and Sealed this  
Twenty-first Day of April, 2015

Michelle K. Lee  
*Director of the United States Patent and Trademark Office*